(12) United States Patent
Tanaka

(10) Patent No.: US 7,750,833 B2
(45) Date of Patent: Jul. 6, 2010

(54) D/A CONVERSION CIRCUIT AND SEMICONDUCTOR DEVICE

(75) Inventor: Yukio Tanaka, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 12/188,739

(22) Filed: Aug. 8, 2008

(65) Prior Publication Data

US 2009/0066678 A1 Mar. 12, 2009

Related U.S. Application Data

(60) Continuation of application No. 10/900,921, filed on Jul. 28, 2004, now Pat. No. 7,411,535, which is a division of application No. 10/034,797, filed on Dec. 28, 2001, now Pat. No. 6,774,833, which is a division of application No. 09/638,842, filed on Aug. 14, 2000, now Pat. No. 6,356,223.

(30) Foreign Application Priority Data

Aug. 16, 1999 (JP) ................. 11-229860

(51) Int. Cl.
*H03M 1/66* (2006.01)
(52) U.S. Cl. .................. 341/144; 341/136; 342/92; 342/98
(58) Field of Classification Search .......... 341/144, 341/156, 87, 690
See application file for complete search history.

(56) References Cited

U.S. PATENT DOCUMENTS 4,398,207 A 8/1983 Hoff, Jr. et al.
4,578,701 A 3/1986 Nakaji
4,801,819 A 1/1989 Theus et al.
5,170,158 A 12/1992 Shinya (Continued)

FOREIGN PATENT DOCUMENTS

EP 0 821 490 A1 1/1998

(Continued)

OTHER PUBLICATIONS

Lewis, A.G. et al, "TA 7.3: Switched-Capacitor Circuits Using Polysilicon on Quartz Thin-Film Technology," ISSCC 92/Session 7/Circuits for Transducers and Active-Matrix LCD Drivers/Paper 7.3, IEEE International Solid State Circuits Conference, 1992, pp. 122-123.

(Continued)

*Primary Examiner*—Jean B Jeanglaude
(74) *Attorney, Agent, or Firm*—Husch Blackwell Sanders LLP

(57) ABSTRACT

A D/A conversion circuit in accordance with the present invention, which is provided with a switch swD, allows a writing operation of a voltage (a true gradation voltage) to be performed at a higher speed by first applying a first voltage (a voltage close to the true gradation voltage), which is supplied without passing through a resistor element, to an output line and then applying a second voltage (the true gradation voltage), which is supplied via the resistor element, to the output line. Thus, the present invention can provide a D/A conversion circuit capable of writing display data to liquid crystal cells with higher precision at higher speed, and a semiconductor device utilizing such a D/A conversion circuit.

20 Claims, 21 Drawing Sheets

U.S. PATENT DOCUMENTS

| | | | |
|---|---|---|---|
| 5,434,599 A | 7/1995 | Hirai et al. | |
| 5,489,904 A * | 2/1996 | Hadidi | 341/156 |
| 5,570,105 A | 10/1996 | Koyama | |
| 5,572,211 A | 11/1996 | Erhart et al. | |
| 5,589,847 A | 12/1996 | Lewis | |
| 5,643,826 A | 7/1997 | Ohtani et al. | |
| 5,648,277 A | 7/1997 | Zhang et al. | |
| 5,703,617 A | 12/1997 | Callahan, Jr. et al. | |
| 5,714,953 A * | 2/1998 | Mitani et al. | 341/144 |
| 5,731,774 A | 3/1998 | Fujii et al. | |
| 5,731,796 A | 3/1998 | Furuhashi et al. | |
| 5,793,348 A | 8/1998 | Lee et al. | |
| 5,801,673 A | 9/1998 | Shimada et al. | |
| 5,903,234 A | 5/1999 | Kimura | |
| 5,923,962 A | 7/1999 | Ohtani et al. | |
| 5,977,940 A | 11/1999 | Akiyama et al. | |
| 6,040,812 A | 3/2000 | Lewis | |
| 6,091,390 A | 7/2000 | Sim | |
| 6,111,557 A | 8/2000 | Koyama et al. | |
| 6,127,995 A | 10/2000 | Furuhashi et al. | |
| 6,147,667 A | 11/2000 | Yamazaki et al. | |
| 6,151,005 A | 11/2000 | Takita et al. | |
| 6,281,826 B1 | 8/2001 | Kimura | |
| 6,281,891 B1 | 8/2001 | DaCosta et al. | |
| 6,304,241 B1 | 10/2001 | Udo et al. | |
| 6,356,223 B1 | 3/2002 | Tanaka | |
| 6,384,807 B1 | 5/2002 | Furuhashi et al. | |
| 6,411,273 B1 | 6/2002 | Nakamura et al. | |
| 6,441,758 B1 | 8/2002 | Koyama et al. | |
| 6,459,395 B1 | 10/2002 | Kida et al. | |
| 6,496,130 B2 | 12/2002 | Nagao | |
| 6,597,349 B1 | 7/2003 | Koyama et al. | |
| 6,600,436 B2 | 7/2003 | Tanaka | |
| 6,614,376 B2 | 9/2003 | Tanaka et al. | |
| 6,744,415 B2 * | 6/2004 | Waterman et al. | 345/87 |
| 6,774,833 B2 | 8/2004 | Tanaka | |
| 6,873,312 B2 | 3/2005 | Matsueda | |
| 6,911,926 B2 | 6/2005 | Koyama et al. | |
| 7,038,649 B2 | 5/2006 | Furuhashi et al. | |
| 7,079,062 B2 * | 7/2006 | Panov et al. | 341/144 |
| 2002/0021235 A1 | 2/2002 | Koyama et al. | |
| 2006/0023001 A1 * | 2/2006 | Sung et al. | 345/690 |
| 2006/0125764 A1 | 6/2006 | Furuhashi et al. | |
| 2007/0158689 A1 | 7/2007 | Koyama et al. | |

FOREIGN PATENT DOCUMENTS

| | | |
|---|---|---|
| EP | 0 915 361 A1 | 5/1999 |
| EP | 0 920 135 A2 | 6/1999 |
| EP | 0 938 074 A1 | 8/1999 |
| EP | 1 601 106 A2 | 11/2005 |
| EP | 1 826 907 A1 | 8/2007 |
| JP | 58-30231 | 2/1983 |
| JP | 4-237091 | 8/1992 |
| JP | 6-208343 | 7/1994 |
| JP | 6-222741 | 8/1994 |
| JP | 6-348236 | 12/1994 |
| JP | 7-130652 | 5/1995 |
| JP | 7-135318 | 5/1995 |
| JP | 8-78329 | 3/1996 |
| JP | 8-227283 | 9/1996 |
| JP | 8-237097 | 9/1996 |
| JP | 9-9275 | 1/1997 |
| JP | 9-326701 | 12/1997 |
| JP | 11-142807 | 5/1999 |
| JP | 11-167373 | 6/1999 |
| JP | 11-218739 | 8/1999 |
| JP | 2000-36749 | 2/2000 |

OTHER PUBLICATIONS

Furuhashi, T. et al, "23.4: A 64-Gray-Scale Digital Signal Driver for Color TFT-LCDs," SID 94 Digest, 1994, pp. 359-362.

Morita, T. et al, "VGA Driving with Low Temperature Processed Poly Si TFTs," IDEM 95, 1995, pp. 841-843.

Yamamoto, Y. et al, "S16-4 Post Deadline Paper, High Performance Low Temperature Poly-Si TFT with Self-Aligned Offset Gate Structure by Anodic Oxidation of Al for a Driver Monolithic LCDs," Asia Display '95, 1995, pp. 941-942.

Matsueda, Y. et al, "4.2: Low-Temperature Poly-Si TFT-LCD with Integrated 6-bit Digital Data Drivers," SID 96 Digest, 1996, pp. 21-24.

Koyama, J. et al, "Low-Temperature Poly-Si TFT-LCDs with Digital Interface," Extended Abstracts of the 1997 International Conference on Solid State Device and Materials, Hamamatsu, 1997, pp. 348-349.

Ohtani, H. et al, "LP-B: Late-News Poster: A 60-in. HDTV Rear-Projector with Continuous-Grain-Silicon Technology," SID 98 Digest, 1998, pp. 467-470.

Osame, M. et al, "40.1: A 2.6-in. Poly-Si TFT-LCD HDTV Display with Monolithic Integrated 8-bit Digital Data Drivers," SID 98 Digest, 1998, pp. 1059-1062.

* cited by examiner

TOWARD SOURCE SIGNAL LINE

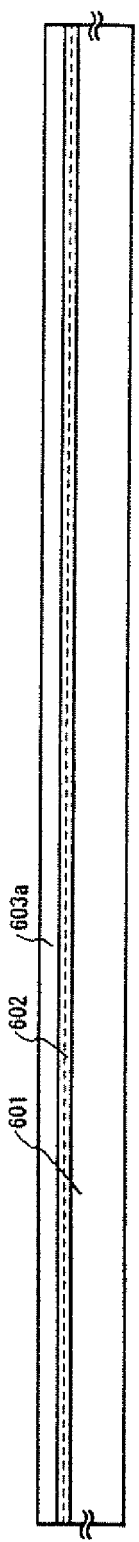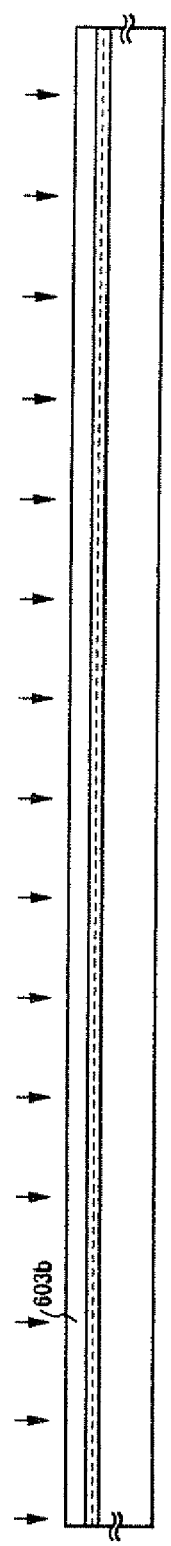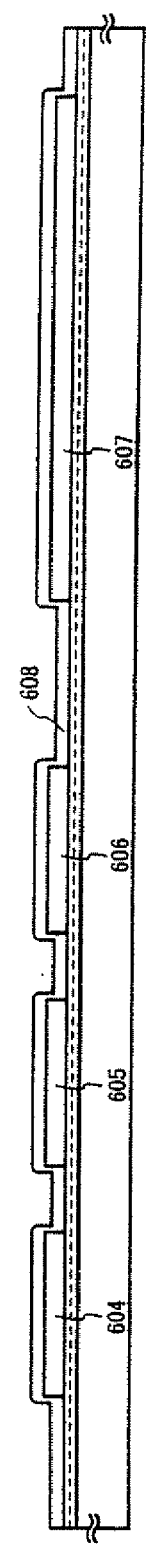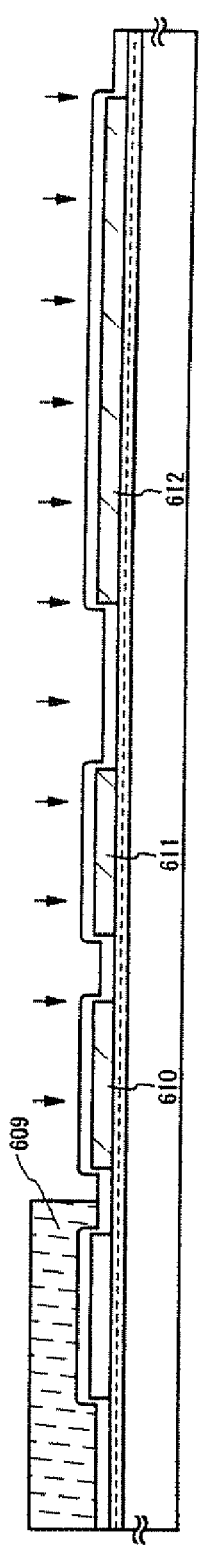

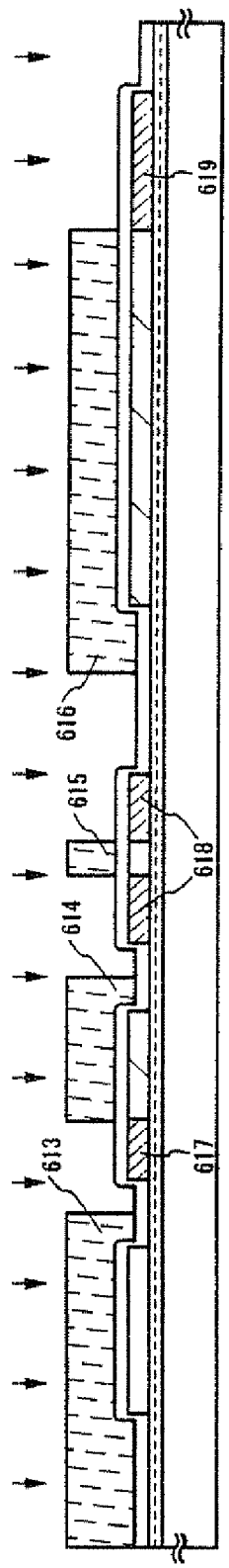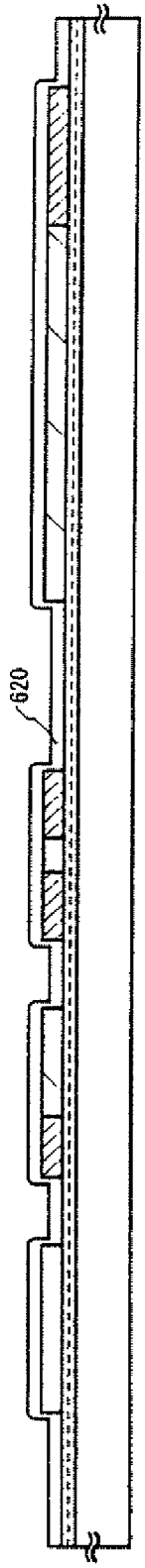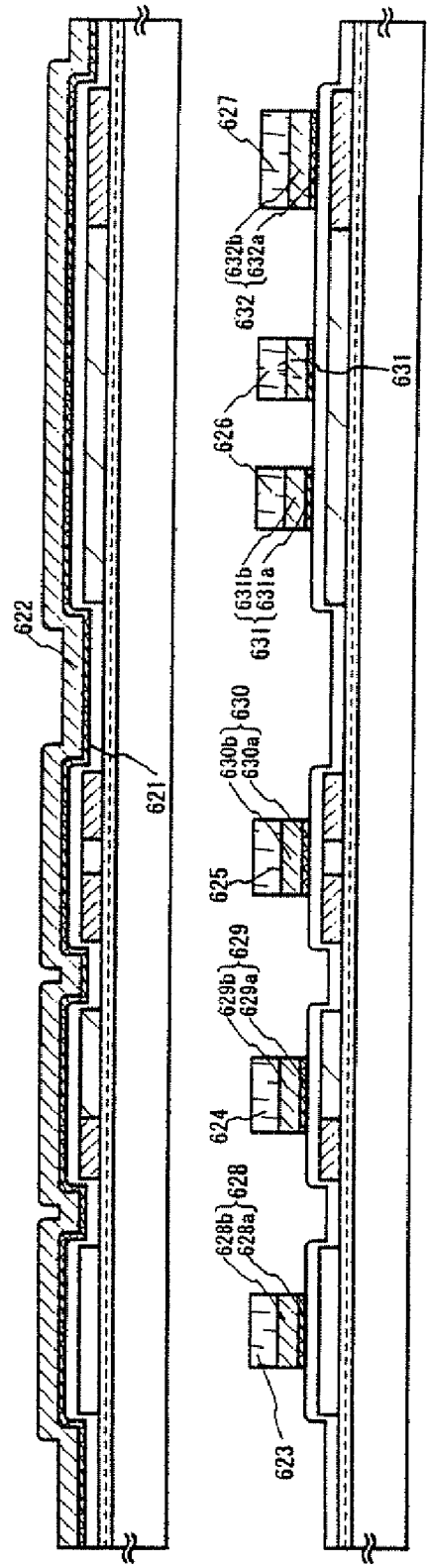

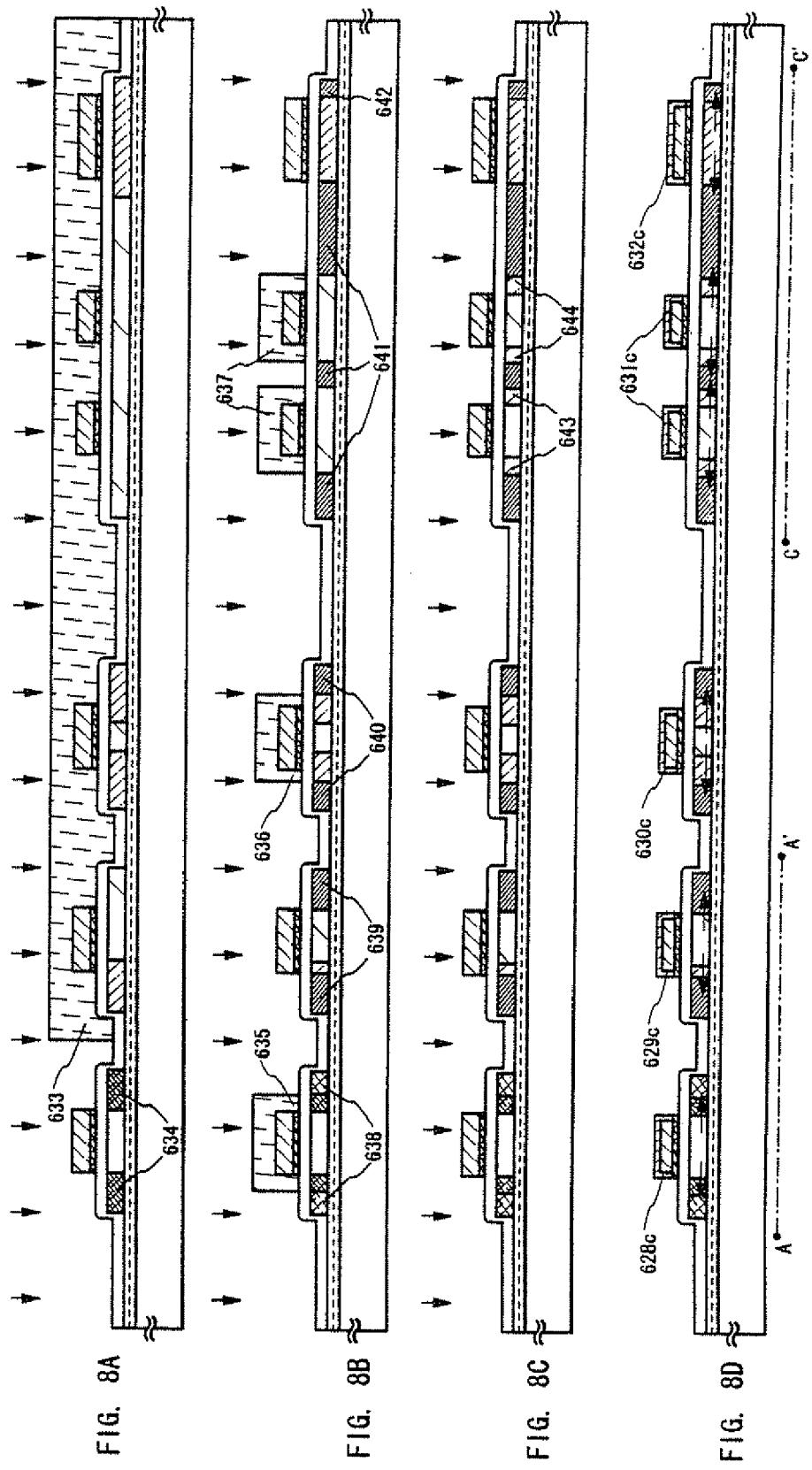

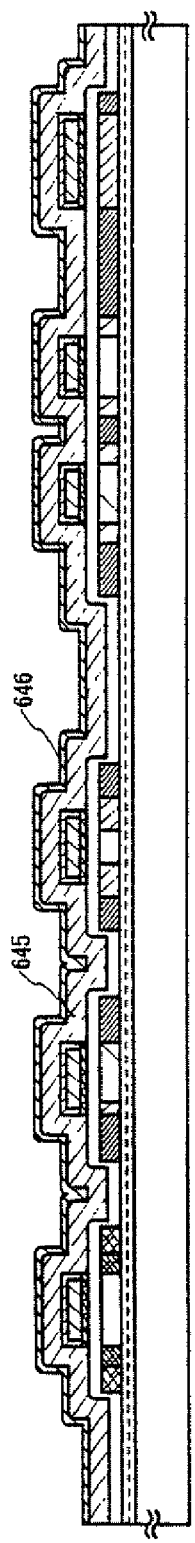
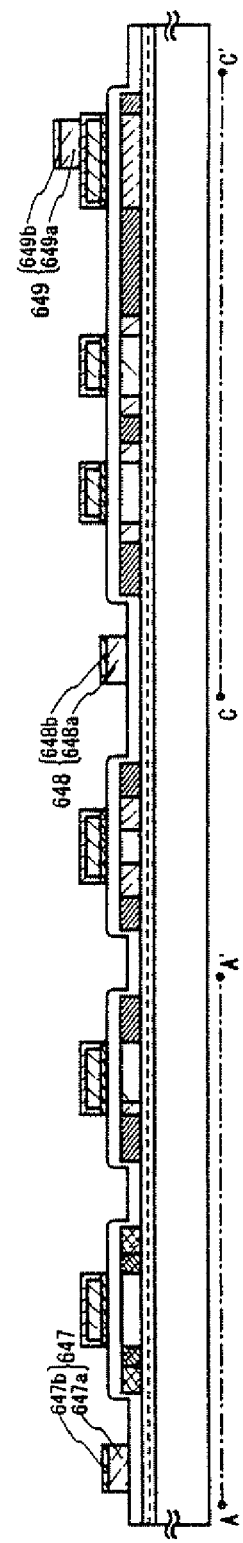
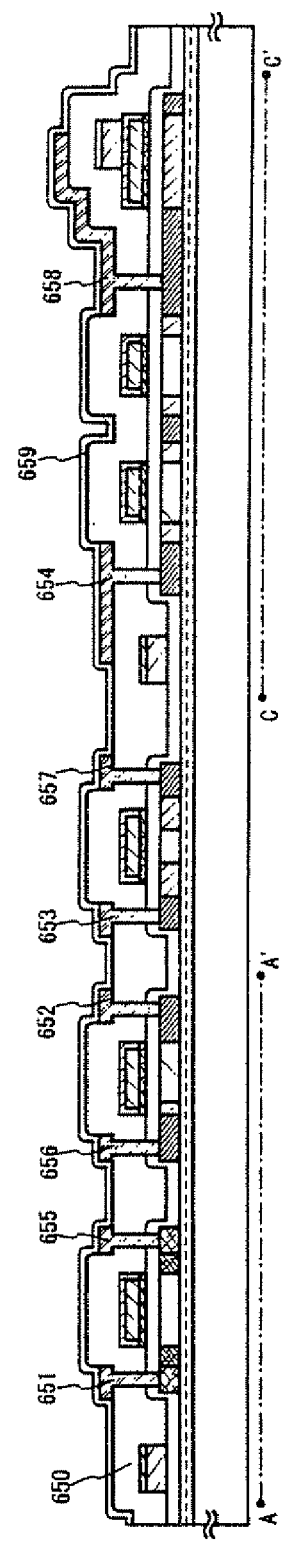
FIG. 9A
FIG. 9B
FIG. 9C

TOWARD SCREEN

TOWARD SCREEN

D/A CONVERSION CIRCUIT AND SEMICONDUCTOR DEVICE

This application is a continuation of U.S. application Ser. No. 10/900,921 filed on Jul. 28, 2004 now U.S. Pat. No. 7,411,535 which is a divisional of U.S. application Ser. No. 10/034,797, filed on Dec. 28, 2001 (now U.S. Pat. No. 6,774,833 issued Aug. 10, 2004) which is a divisional of U.S. application Ser. No. 09/638,842, filed on Aug. 14, 2000 (now U.S. Pat. No. 6,356,223 issued Mar. 12, 2002).

BACKGROUND OF THE INVENTION

1. Field of the Invention

The present invention relates to a D/A conversion (digital/analog conversion) circuit, and more particularly, to a D/A conversion circuit to be used in a driver circuit of a semiconductor device.

It should be noted that in this specification, the term "semiconductor device" is intended to generally indicate all of such an apparatus capable of operating by employing semiconductor properties. For example, the semiconductor device can include an electro-optical device, a semiconductor circuit, or an electronic equipment.

2. Description of the Related Art

In recent years, the technique for manufacturing a semiconductor device, e.g., a thin film transistor (TFT), in which a semiconductor thin film is formed on an inexpensive glass substrate shows rapid advancement because of increased demand for an active matrix type semiconductor display device (in particular, an active matrix type liquid crystal display device).

The active matrix type liquid crystal display device includes several hundred thousands to several millions of pixel regions arranged in matrix. Each of the pixel regions is provided with a TFT which controls, through its switching function, electric charges to be supplied to or discharged from a corresponding pixel electrode.

Specifically, with high finer processing and higher image quality of a display device being required, an active matrix type liquid crystal display device of digital driving type capable of operating at a higher speed has drawn much attention.

FIG. 19 shows a conventional active matrix type liquid crystal display device of digital driving type. This conventional active matrix type liquid crystal display device of digital driving type is composed of, as shown in FIG. 19, such components as a source signal line shift register 1401, digital decoder address lines (a-d) 1402, latch circuits (LAT1) 1403, other latch circuits (LAT2) 1404, a latch pulse line 1405, D/A conversion circuits 1406, gradation gray scale) voltage lines 1407, source signal lines 1408, a gate signal line shift register 1409, gate signal lines (scanning lines) 1410, and pixel TFTs 1411. Herein, a 4-bit active matrix type liquid crystal display device of digital driving type is taken as an example. It should be noted that for simplicity, each of the illustrated latch circuits (LAT1 and LAT2) in FIG. 19 actually represents four of the latch circuits.

Digital signals (digital gradation signals) supplied to the address lines (a-d) 1402 of the digital decoder are sequentially written onto groups of the latch circuits LAT1 (LAT1 groups) in accordance with timing signals supplied from the source signal line shift register 1401.

A time period required until completion of a set of writing operations of the digital signals for the LAT1 groups is referred to as "one line period". More specifically, the one line period corresponds to a time period from the time when the writing operation of the digital signal from the digital decoder to the most leftward LAT1 is started until the time when the writing operation of the digital signal from the digital decoder to the most rightward LAT1 is completed.

After the completion of writing operations of the digital signals for the LAT1 groups, the digital signals thus written into the LAT1 groups are simultaneously transmitted to and written onto the LAT2 groups at the time when a latch pulse appears on the latch pulse line in accordance with the operation timings of the shift register.

Onto the LAT1 groups that have thus transmitted the digital signals to the LAT2 groups, other digital signals supplied to the digital decoder are again written sequentially in accordance with the signals supplied from the source signal line shift register.

During this second-round one line period, voltages in accordance with the digital signals transmitted to the LAT2 groups are supplied to the source signal lines in synchronization with the start of the second-turn one line period. In the exemplary driver circuit described herein, conversion of the digital signals into gradation voltages is implemented by selecting one of the 16 gradation voltage lines by means of the D/A conversion circuit.

The selected gradation voltage is supplied to the corresponding source signal line during the one line period. The corresponding TFT is switched in response to a scanning signal from the gate signal line shift register so that liquid crystal molecules are driven.

By repeating the above-mentioned operations for the number of the scanning lines, one picture (one frame) is created. In general, in the active matrix type liquid crystal display device, 60 frames of images are switched per second.

With reference to FIG. 20, a conventional D/A conversion circuit to be used in the above-mentioned digital driver circuit will be described below.

The conventional 4-bit D/A conversion circuit comprises a plurality of switches (sw0-sw15) and a plurality of gradation voltage lines (V0-V15). One of the switches (sw0-sw15) is selected in accordance with the 4-bit digital signal supplied from the LAT2 groups, and a voltage is supplied to the source signal line 1407 from the gradation voltage line coupled to the selected switch.

One D/A conversion circuit as described above is provided substantially to each of the source signal lines.

The conventional 4-bit D/A conversion circuit as set forth above includes the 16 switches and the 16 gradation voltage lines. Furthermore, the number of the switches will be required to increase in an exponential manner with an increase in the number of bits. In other words, the conventional D/A conversion circuit intended to handle n-bit digital signal requires $2^n$ switches. Accordingly, in an actual active matrix type liquid crystal display device, a large area is occupied by the switches, resulting in a large area occupied by the whole driver circuit. This is disadvantageous for realizing miniaturization of the device.

With reference to FIG. 21, another conventional D/A conversion circuit to be used in the above-mentioned digital driver circuit will be described below. In the 4-bit D/A conversion circuit as shown in FIG. 21, similarly to the 4-bit D/A conversion circuit as described above, one of the switches (sw0-sw15) is selected in accordance with the 4-bit digital signal supplied from the LAT2 groups, and a voltage is supplied to the source signal line from the gradation voltage line coupled to the selected switch.

The D/A conversion circuit shown in FIG. 21 includes five gradation voltage lines (V0-V4), and the number of the line is less than that of the 4-bit D/A conversion circuit in FIG. 20 as described above.

The voltage to be applied across the V0 to V4 is divided by way of resistors so that voltages of different levels are supplied to the respective five gradation voltage lines (V0-V4). In particular, the highest voltage is applied to the V4, while the lowest voltage is applied to the V0.

However, the D/A conversion circuit shown in FIG. 21 has a problem in which the overall resistance becomes large because the voltages to be applied to the respective gradation voltage lines are divided via the resistors, whereby a sufficient writing time of display data to a liquid crystal panel cannot be obtained.

In addition, when the number of bits increases, a device resistance and wiring resistance also increase.

Furthermore, in order to realize high finer definition of a semiconductor display device, the number of pixels, i.e., the number of source signal lines, are required to be increased.

Moreover, as described previously, an increase in the number of source signal lines leads to an increase in the area occupied by the D/A conversion circuit, as well as increases in the wiring remittances and the device resistance. These will also prevent high finer definition from being realized.

SUMMARY OF THE INVENTION

In view of the disadvantages as described above, an object of the present invention is to provide a D/A conversion circuit capable of writing display data to liquid crystal cells with higher precision at a higher speed, and a semiconductor device utilizing such a D/A conversion circuit.

According to the present invention, there is provided a D/A conversion circuit for supplying to an output line a gradation voltage corresponding to n-bit digital signal (n is a natural number that is equal to or larger than 2) to be input, characterized in that:

the n-bit digital signal is divided into upper x bit(s) and lower y bit(s) (where x+y=n; both x and y are natural numbers);

adjacent two gradation voltage lines among ($2^x$+1) gradation voltage lines are selected in accordance with the upper x bit(s) of the n-bit digital signal;

after a first gradation voltage applied to either one of the selected adjacent two gradation voltage lines is supplied to the output line, $2^y$ second gradation voltages are generated from a potential difference between the selected adjacent two gradation voltage lines by the lower y bit(s) of the n-bit digital signal; and one of the $2^y$ second gradation voltages is supplied to the output line.

Further, according to the present invention, there is provided a D/A conversion circuit for supplying to an output line a gradation voltage corresponding to n-bit digital signal (n is a natural number that is equal to or larger than 2) to be input, characterized in that:

the n-bit digital signal is divided into upper x bit(s) and lower y bit(s) (where x+y=n; both x and y are natural numbers);

the z-th and (z+1)-th gradation voltage lines among ($2^x$+1) gradation voltage lines are selected in accordance with the upper x bit(s) of the n-bit digital signal (where z is a natural number in the range from 1 to $2^x$);

after a first gradation voltage applied to either one of the selected z-th and (z+1)-th gradation voltage lines is supplied to the output line, $2^y$ second gradation voltages are generated from a potential difference between the selected z-th and (z+1)-th gradation voltage lines by the lower y bit(s) of the n-bit digital signal; and one of the $2^y$ second gradation voltages is supplied to the output line.

Still further, in the above-mentioned respective structures, it is characterized in that the D/A conversion circuit is manufactured on an insulating substrate by using a thin film transistor.

Yet further, in the above-mentioned respective structures, it is characterized in that the first gradation voltage is lower than a voltage value applied to the other one of the selected adjacent two gradation voltage lines.

Furthermore, according to the present invention, there is provided a semiconductor device, comprising:

a plurality of TFTs arranged in matrix; and a source signal line driver circuit and a gate signal line driver circuit both for driving the plurality of TFTs, characterized in that the source signal line driver circuit comprises a D/A conversion circuit for supplying to an output line a gradation voltage corresponding to n-bit digital signal (n is a natural number that is equal to or larger than 2) to be input, the n-bit digital signal is divided into upper x bit(s) and lower y bit(s) (where x+y=n; both x and y are natural numbers);

adjacent two gradation voltage lines among ($2^x$+1) gradation voltage lines are selected in accordance with the upper x bit(s) of the n-bit digital signal;

after a first gradation voltage applied to either one of the selected adjacent two gradation voltage lines is supplied to the output line, $2^y$ second gradation voltages are generated from a potential difference between the selected adjacent two gradation voltage lines by the lower y bit(s) of the n-bit digital signal; and one of the $2^y$ second gradation voltages is supplied to the output line.

Still further, there is provided a semiconductor device, comprising:

a plurality of TFTs arranged in matrix; and a source signal line driver circuit and a gate signal line driver circuit both for driving the plurality of TFTs, characterized in that the source signal line driver circuit comprises a D/A conversion circuit for supplying to an output line a gradation voltage corresponding to n-bit digital signal (n is a natural number that is equal to or larger than 2) to be input, the n-bit digital signal is divided into upper x bit(s) and lower y bit(s) (where x+y=n; both x and y are natural numbers);

the z-th and (z+1)-th gradation voltage lines among ($2^x$+1) gradation voltage lines are selected in accordance with the upper x bit(s) of the n-bit digital signal (where z is a natural number in the range from 1 to $2^x$);

after a first gradation voltage applied to either one of the selected z-th and (z+1)-th gradation voltage lines is supplied to the output line, $2^y$ second gradation voltages are generated from a potential difference between the selected z-th and (z+1)-th gradation voltage lines by the lower y bit(s) of the n-bit digital signal; and one of the $2^y$ second gradation voltages is supplied to the output line.

Yet further, according to the present invention, there is provided a semiconductor device, comprising:

a plurality of TFTs; and a source signal line driver circuit and a gate signal line driver circuit both for driving the plurality of TFTs, characterized in that the source signal line driver circuit comprises a D/A conversion circuit for supplying to an output line a gradation voltage corresponding to n-bit digital signal (n is a natural number that is equal to or larger than 2) to be input, the n-bit digital signal is divided into upper x bit(s) and lower y bit(s) (where x+y=n; both x and y are natural numbers);

the z-th and (z+1)-th gradation voltage lines among ($2^x+1$) gradation voltage lines are selected in accordance with the upper x bit(s) of the n-bit digital signal (where z is a natural number in the range from 1 to $2^x$);

after a first gradation voltage applied to either one of the selected z-th and (z+1)-th gradation voltage lines is supplied to the output line, $2^y$ second gradation voltages are generated from a potential difference between the selected z-th and (z+1)-th gradation voltage lines by the lower y bit(s) of the n-bit digital signal; and one of the $2^y$ second gradation voltages is supplied to the output line.

Yet still further, in the above-mentioned respective structures, it is characterized in that the plurality of TFTs, the source signal line driver circuit, and the gate signal line driver circuit are integrally manufactured on an insulating substrate by using a thin film transistor.

Furthermore, Still further, in the above-mentioned respective structures, it is characterized in that the first gradation voltage is lower than a voltage value applied to the other one of the selected adjacent two gradation voltage lines.

BRIEF DESCRIPTION OF THE DRAWINGS

In the accompanying drawings:

FIGS. 6A to 6D show cross-sectional views illustrating manufacturing steps of a pixel TFT, a holding capacitor, and a TFT in a driver circuit;

FIGS. 7A to 7D show cross-sectional views illustrating manufacturing steps of a pixel TFT, a holding capacitor, and a TFT in a driver circuit;

FIGS. 8A to 8D show cross-sectional views illustrating manufacturing steps of a pixel TFT, a holding capacitor, and a TFT in a driver circuit;

FIGS. 9A to 9C show cross-sectional views illustrating manufacturing steps of a pixel TFT, a holding capacitor, and a TFT in a driver circuit;

DETAILED DESCRIPTION OF THE PREFERRED EMBODIMENTS

Hereinbelow, some of embodiments of the present invention will be described.

A D/A conversion circuit in accordance with the present invention allows a writing operation of a voltage (a true gradation voltage) to be performed at a higher speed by first applying a first voltage (a voltage close to the true gradation voltage), which is supplied without passing through a resistor element, to an output line and then applying a second voltage (the true gradation voltage), which is supplied via the resistor element, to the output line.

Specifically, in the D/A conversion circuit of the present invention, the first voltage is written to the output line beforehand and then the second voltage is written to the output line so as to increase the voltage level from the first voltage to the true gradation voltage. Thus, a display voltage can be written at a very high speed.

In accordance with the present invention, the D/A conversion circuit for supplying to an output line a gradation voltage corresponding to n-bit digital signal (n is a natural number that is equal to or larger than 2) to be input, comprises: a first D/A conversion circuit for dividing the n-bit digital signal into upper x bit(s) and lower y bit(s) (where x+y=n; both x and y are natural numbers) and selecting adjacent two gradation voltage lines among ($2^x+1$) gradation voltage lines in accordance with the upper x bit(s) of the n-bit digital signal; a plurality of input lines coupled to each other via a plurality of resistors connected in series with digital signals having different potentials being respectively supplied thereto; and a second D/A conversion circuit. The second D/A conversion circuit includes: a first switch circuit designed so that only one of a plurality of switches is closed in accordance with the applied digital signal; and a second switch circuit designed so that a switch is closed immediately before the first switch is closed and the thus-closed switch is opened after application of a predetermined voltage value.

The predetermined voltage value may be equal to a voltage value which is being applied either one of the adjacent two gradation voltage lines by the first D/A conversion circuit. In the case where power consumption is required to be reduced, among the adjacent two gradation voltage lines, the one to which a lower voltage value is being applied is connected to the second switch circuit without a resistor element interposed therebetween.

Furthermore, when the second switch circuit is turned on, only one gradation voltage line (the one to which a lower voltage is being applied) may be selected by the first D/A conversion circuit in order to reduce power consumption.

Figure 3:
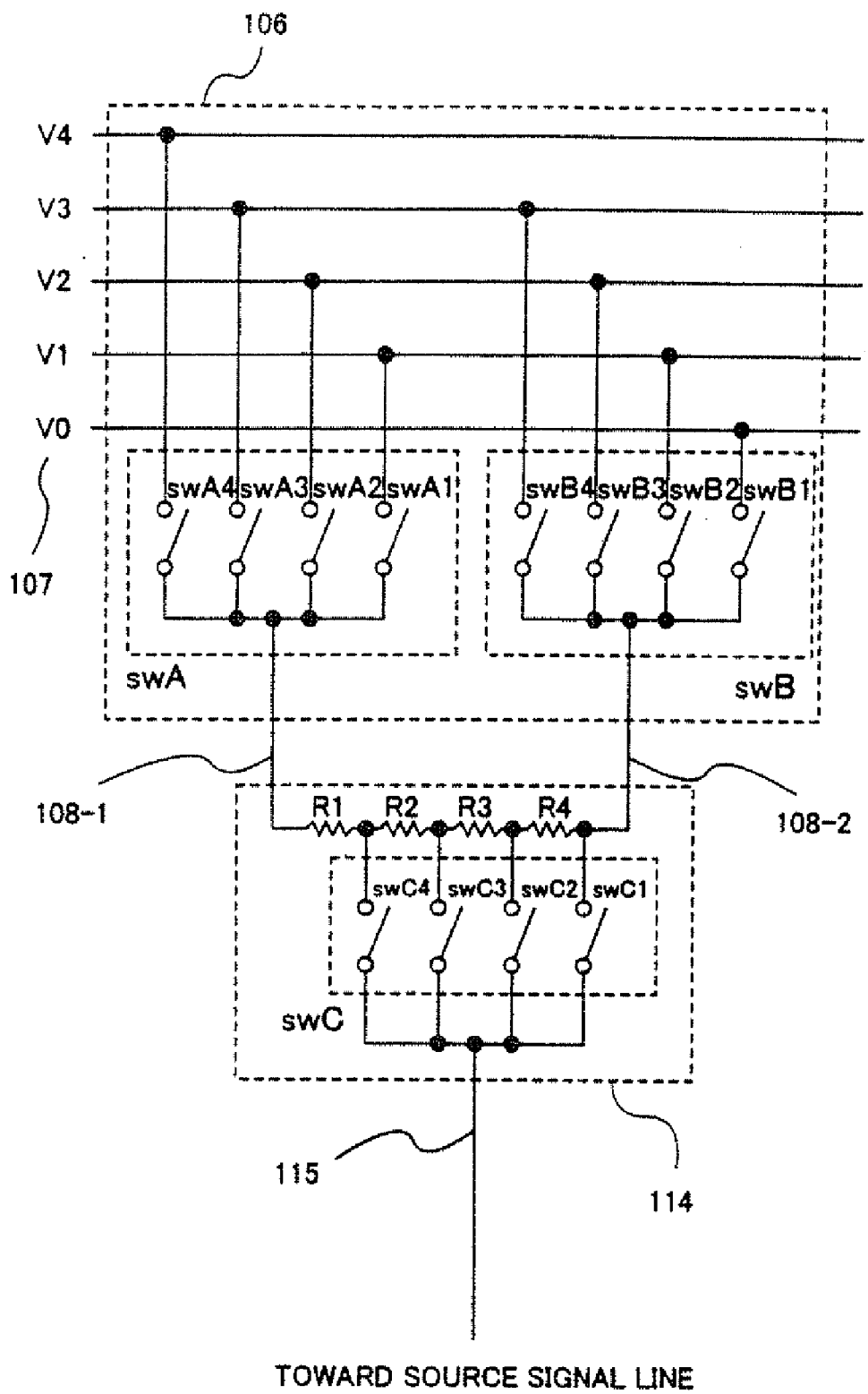
FIG. 3 shows a diagram illustrating the construction of the D/A conversion circuit in accordance with the present invention.
Figure 16:
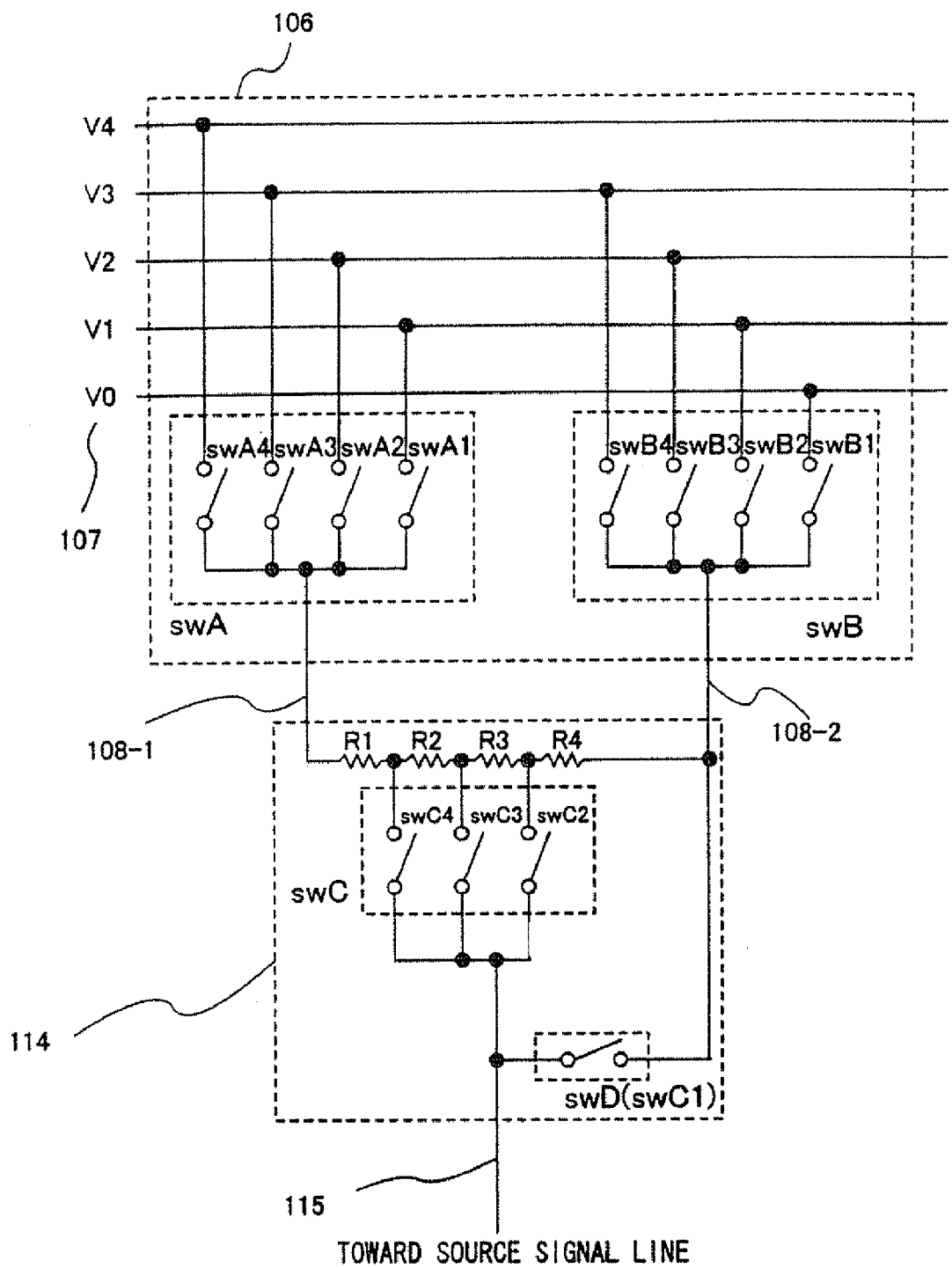
FIG. 16 shows an exemplary circuit diagram of the D/A conversion circuit in accordance with the present invention.
Figure 17:
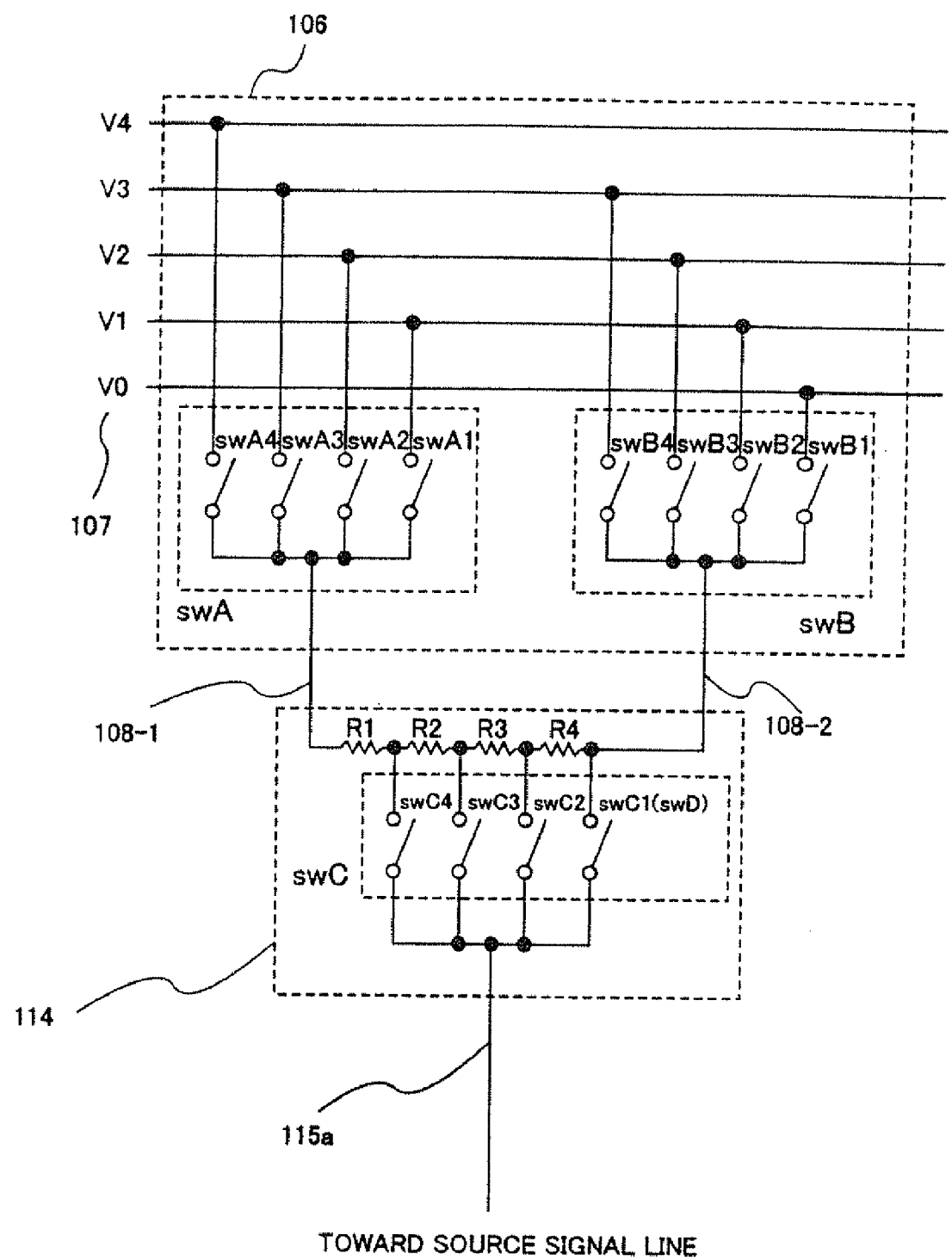
FIG. 17 shows another exemplary circuit diagram of the D/A conversion circuit in accordance with the present invention.

FIG. 3 shows an exemplary configuration of a D/A conversion circuit in accordance with the present invention. It should be noted that the second switch circuit can be designed to also have the function of the first switch circuit as shown in FIG. 16. Alternatively, the first switch circuit can be designed to also have the function of the second switch circuit as shown in FIG. 17. Furthermore, although either one of the input lines to which the different voltage values are being respectively applied can be connected to the second switch circuit, it is preferable that the input line to which a lower voltage value is being supplied is connected to the second switch circuit from the viewpoint of power consumption. In addition, the present invention is in general applicable to a D/A conversion circuit of C2C type.

As can be realized from the above, arrangement and/or connection of the D/A conversion circuit in accordance with the present invention can be arbitrarily modified.

The present invention which has such general construction as described above will be described below in more detail with reference to some embodiments thereof.

Embodiment 1

In Embodiment 1, an embodiment of a D/A conversion circuit in accordance with the present invention will be described. Specifically, the present embodiment describes details of the D/A conversion circuit provided in a source signal line driver circuit in an active matrix type liquid crystal display device having pixels of 800 (along a horizontal direction)×600 (along a vertical direction) for converting a digital signal into an analog gradation signal (gradation voltage).

Although the D/A conversion circuit for processing a 4-bit digital signal will be described in the present embodiment, the present invention is not limited to this case. The present invention can be applied to any D/A conversion circuits for processing a digital signal of 2 bits or more.

Figure 1:
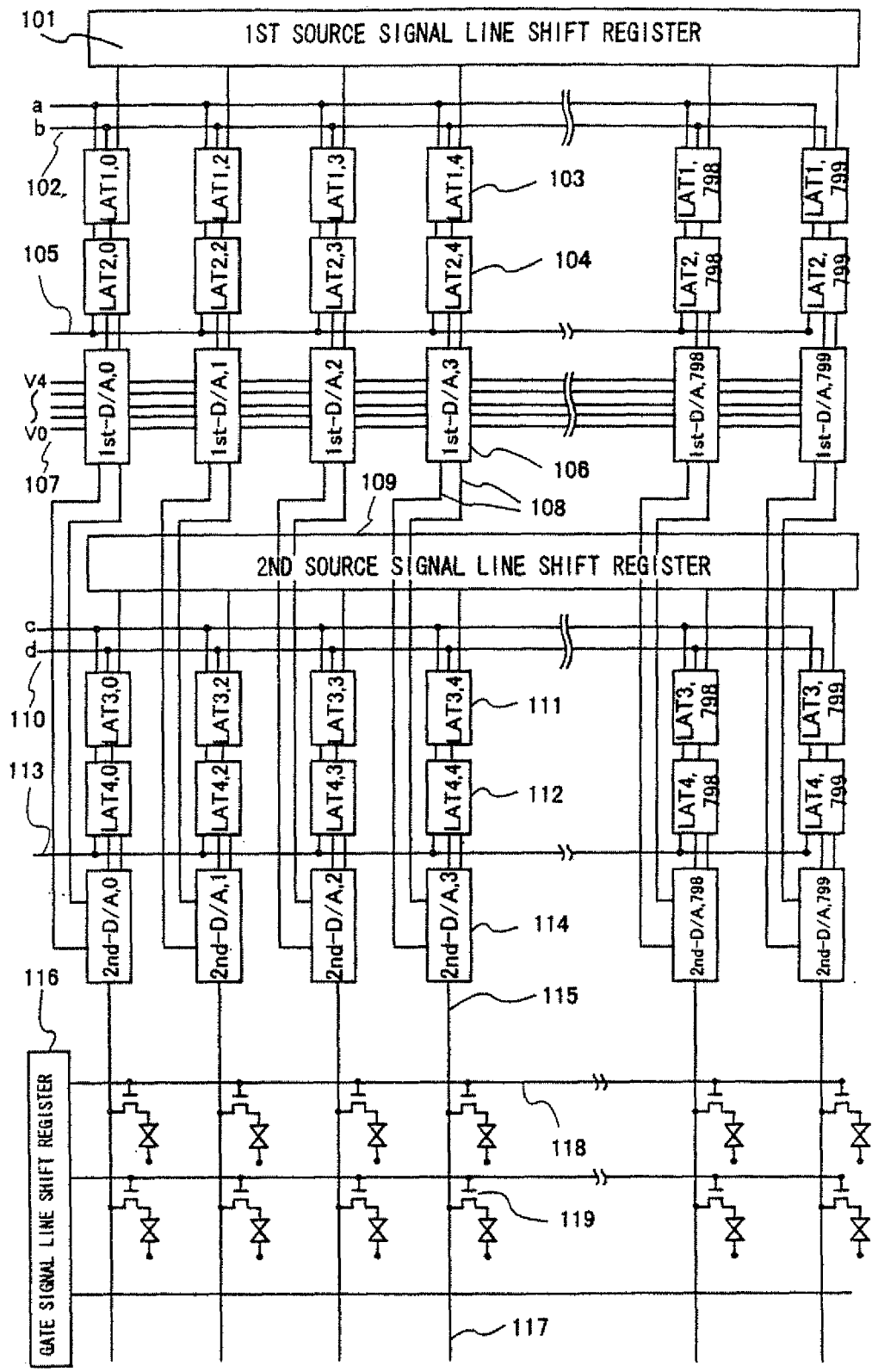
FIG. 1 shows a schematic diagram illustrating the construction of an active matrix type liquid crystal display device including a D/A conversion circuit in accordance with the present invention.

FIG. 1 shows a schematic diagram illustrating the construction of an active matrix type liquid crystal display device in accordance with the present embodiment.

The active matrix type liquid crystal display device in accordance with the present embodiment is composed of various components such as a first source signal line shift register 101, digital decoder address lines (a, b) 102, latch circuits (LAT1,0 to LAT1,799) 103, latch circuits (LAT2,0 to LAT2,799) 104, a latch pulse line 105, first D/A conversion circuits (1st-D/A,0 to 1st-D/A,799) 106, gradation voltage lines (V0 to V4) 107, first output lines 108, a second source signal line shift register 109, digital decoder address lines (c, d) 110, latch circuits (LAT3,0 to LAT3,799) 111, latch circuits (LAT4,0 to LAT4,799) 112, a latch pulse line 113, second D/A conversion circuits (2nd-D/A,0 to 2nd-D/A,799) 114, second output lines 115, a gate signal line shift register 116 as a gate signal line driver circuit, source signal lines 117, gate signal lines (scanning lines) 118, and pixel TFTs 119.

Although not illustrated in FIG. 1, other components such as a buffer or an analog switch can be appropriately provided.

Among a 4-bit digital signal to be externally supplied, the upper 2 bits are supplied to the address lines a and b 102, respectively, while the lower 2 bits are supplied to the address lines c and d 110, respectively.

Voltages of different levels are supplied to the respective five gradation voltage lines (V0-V4) 107 by dividing a voltage to be applied across the V0 to V4 by way of resistors. In particular, the highest voltage is applied to the V4, while the lowest voltage is applied to the V0.

The gradation voltage line to which the lowest voltage is supplied is referred to as a first gradation voltage line, while the gradation voltage line to which the highest voltage is supplied is referred to as a fifth gradation voltage line. Thus, among the first through fifth gradation voltage lines, the higher-order gradation voltage lines are supplied with voltages of higher levels.

The first source line shift register 101 supplies latch signals (timing signals) sequentially to the latch circuits LAT1,0 to LAT1,799. The latch circuits LAT1,0 to LAT1,799 sequentially receive digital signals from the address lines a and b 102 in accordance with the latch signals supplied from the first source line shift resister, and hold the received digital signals.

At the exact time when the receipt of the digital signal by the latch circuit LAT1,799 is completed, a latch signal is supplied to the latch pulse line 105, and digital signals are simultaneously received by all of the latch circuits LAT2,0 to LAT2,799 from the latch circuits LAT1,0 to LAT1,799, and held therein. The digital signals received by the latch circuits LAT2,0 to LAT2,799 are transmitted to the first D/A conversion circuits 106 during the one line period.

Figure 2:
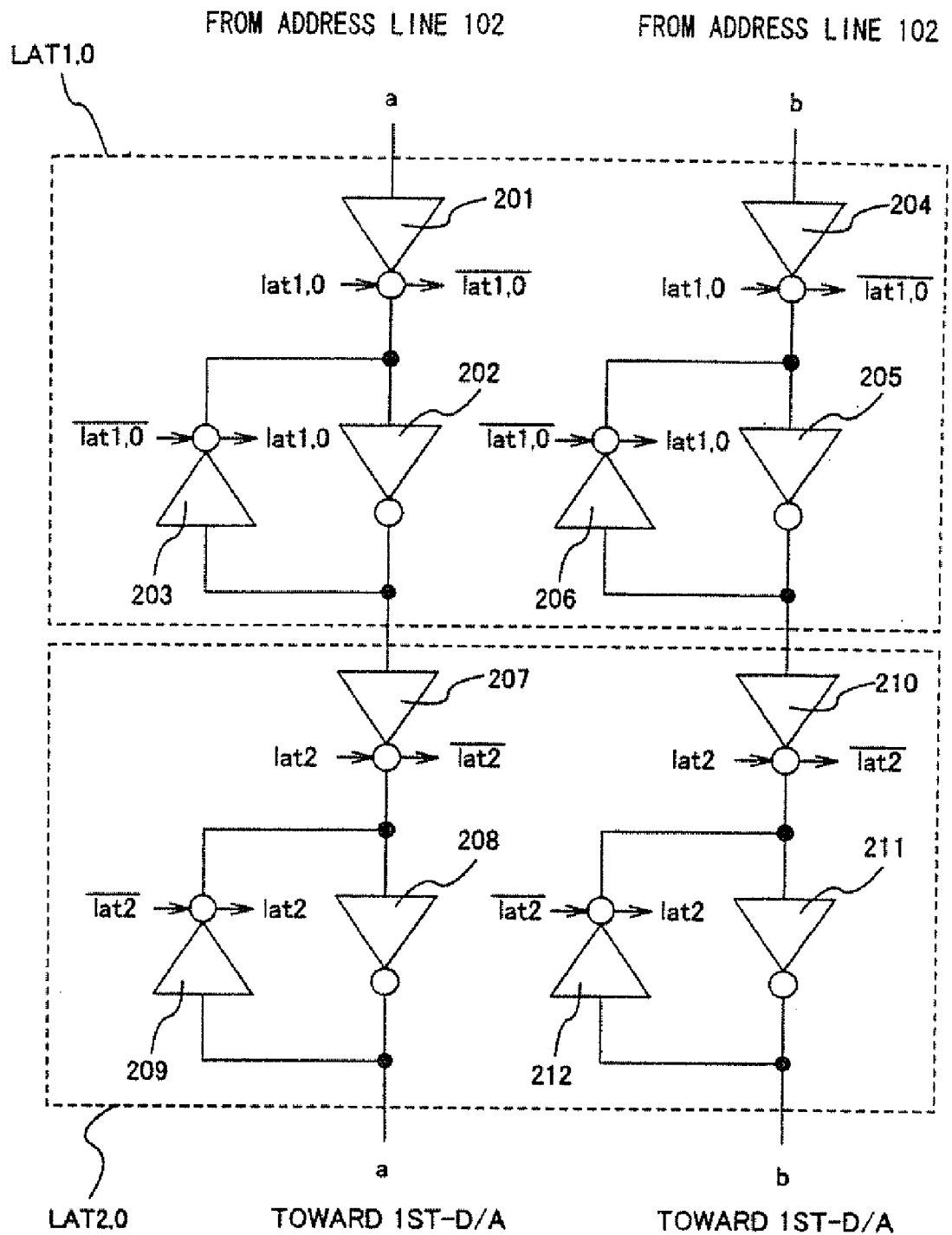
FIG. 2 shows a circuit diagram of a latch circuit.

FIG. 2 shows a circuit diagram of one of the latch circuits (LAT1,0 and LAT2,0). The latch circuits LAT1,0 and the latch circuits LAT2,0 have the same configuration as each other.

The latch circuit LAT1,0 includes clocked inverters 201, 203, 204, 206 and inverters 202, 205, and receives digital signals from the address lines a and b 102 to hold them. The latch signal (lat1,0) from the first source signal line shift resister 101 and an inverted signal thereof (inverted lat1,0) are used for switching the clocked inverters 201, 203, 204, 206.

The latch circuit LAT2,0 includes clocked inverters 207, 209, 210, 212 and inverters 208, 211, and receives digital signals from the latch circuit LAT1,0 to hold them. The latch signal (lat2) from the latch pulse line 105 and an inverted signal thereof (inverted lat2) are used for switching the clocked inverters 207, 209, 210, 212. The latch circuit LAT2,0 transmits the digital signals to the first D/A conversion circuits.

The digital signals to be supplied to the address lines a and b 102 are supplied to the first D/A conversion circuits 106 via the thus-explained two-stage latch circuits. Accordingly, for the purpose of explanation, the signal lines connected to the first D/A conversion circuits are referred to as the a and b signal lines, respectively, in the present embodiment.

The first D/A conversion circuits (1st-D/A,0 to 1st-D/A, 799) 106 are respectively supplied with 2-bit digital signal from the latch circuits LAT2,0 to LAT2,799. The first D/A conversion circuits (1st-D/A,0 to 1st-D/A,799) 106 convert the supplied 2-bit digital signal into analog signals (gradation voltages), and supply them to the second D/A conversion circuits (2nd-D/A,0 to 2nd-D/A,799) 114 via the first output lines 108 (108-1 and 108-2).

In synchronization with the timing when the first source signal line shift register 101 sequentially transmits the latch signals to the latch circuits LAT1,0 to 799, the second source signal line shift register 109 sequentially transmits the latch signals to the latch circuits LAT3,0 to 799. Thus, the first and second source signal line shift registers respectively transmit the latch signals to the latch circuits LAT1,0 and LAT3,0 at the same timings. In addition, the first and second source signal line shift registers respectively transmit the latch signals to the latch circuits LAT1,1 and LAT3,1 at the same timings.

The latch circuits LAT3,0 to LAT3,799 sequentially receive 2-bit digital signal from the address lines c and d 110 in accordance with the latch signals supplied from the second source line shift resister 109, and hold the received digital signals. At the exact time when the receipt of the digital signal by the latch circuit LAT3,799 is completed, a latch signal is supplied to the latch pulse line 113, and digital signals are simultaneously received by all of the latch circuits LAT4,0 to LAT4,799 from the latch circuits LAT3,0 to LAT3,799, and held therein. The digital signals received by the latch circuits LAT4,0 to LAT4,799 are transmitted to the second D/A conversion circuits 114.

The second D/A conversion circuits (2nd-D/A,0 to 2nd-D/A,799) supply gradation voltages to the second output lines 115 connected to the source signal lines, based on the gradation voltages supplied from the output lines 108 of the first D/A conversion circuits and the supplied 2-bit digital signal.

The gradation voltages supplied to the second output lines 115 are further supplied to the source signal lines 117 via a buffer (not illustrated) or the like. In accordance with scanning signals supplied from the gate signal line shift resister 116, the pixel TFT 119 connected to the corresponding gate signal line 118 is turned on so that the gradation voltage is applied to liquid crystal molecules.

Thus, all of the pixel TFTs connected to the selected scanning line are simultaneously turned on to drive liquid crystal molecules. All of the scanning lines are sequentially selected so that an image of 1 frame is generated. In the present embodiment, images of 60 frames are generated per second.

Hereinbelow, the first and second D/A conversion circuits 106 and 114 will be described in detail with reference to FIG. 3.

FIG. 3 shows schematic diagrams of the first and second D/A conversion circuits 106 and 114. Operations of the first and second D/A conversion circuits 106 and 114 will be first described with reference to FIG. 3.

The first D/A conversion circuit 106 has a switch circuit swA including four internal switches (swA1 to swA4), a switch circuit swB including four internal switches (swB1 to swB4), and gradation voltage lines 107 (V0 to V4). The second D/A conversion circuit 114 has a switch circuit swC including four internal switches (swC1 to swC4), four resistors (R1 to R4), and a switch circuit swD. Any inherent resistances of wirings themselves are not considered for simplicity.

In the present embodiment, the internal switch swA4 is connected to the gradation voltage line V4, the internal switches swA3 and swB4 are connected to the gradation voltage line V3, the internal switches swA2 and swB3 are connected to the gradation voltage line V2, the internal switches swA1 and swB2 are connected to the gradation voltage line V1, and the internal switch swB1 is connected to the gradation voltage line V0.

In the first D/A conversion circuits 106, the 2-bit digital signal to be supplied from the address lines a and b via the latch circuits controls the switch circuits swA and swB. In accordance with the digital signals to be supplied from the address lines a and b via the latch circuits, either one of the four internal switches (swA1 to swA4) in the switch circuit swA is designed to be closed. Two or more internal switches are never closed simultaneously. In addition, in accordance with the digital signals to be supplied from the address lines a and b, either one of the four internal switches (swB1 to swB4) in the switch circuit swB is designed to be closed. Similarly, two or more internal switches are never closed simultaneously. Furthermore, closing timings for the four internal switches (swA1 to swA4) in the switch circuit swA and those for the four internal switches (swB1 to swB4) in the switch circuit swB satisfy the following relationship. The internal switch swB1 is closed when the internal switch swA1 is closed, the internal switch swB2 is closed when the internal switch swA2 is closed, the internal switch swB3 is closed when the internal switch swA3 is closed, and the internal switch swB4 is closed when the internal switch swA4 is closed. Accordingly, the adjacent two gradation voltage lines are always selected by the switch circuits swA and swB. Thus, with any input 2-bit digital signal, the adjacent two gradation voltage lines are selected by the switch circuits swA and swB and the gradation voltages are supplied to the first output lines 108 (108-1 and 108-2). Herein, one of the first output lines to be selected by the four internal switches of the switch circuit swA is referred to as the first output line (H) 108-1, while the other first output line to be selected by the four internal switches of the switch circuit swB is referred to as the first output line (L) 108-2.

In the second D/A conversion circuits 114, the 2-bit digital signal to be supplied from the address lines c and d via the latch circuits controls the switch circuit swC. In accordance with the digital signals to be supplied from the address lines c and d via the latch circuits, only one of the four internal switches (swC1 to swC4) in the switch circuit swC is designed to be closed (turned on).

In addition, when either one of the internal switches (swC1 to swC4) is closed (turned on), the switch circuit (swD) is designed to be opened (turned off) at least temporarily. When the switch circuit (swD) is closed, the internal switches (swC1 to swC4) may be closed.

The gradation voltages supplied to the first output line (H) 108-1 and the first output line (L) 108-2 are applied to the second D/A conversion circuit 114. In addition, the first output line (H) 108-1 and the first output line (L) 108-2 are coupled to each other by the four resistors (R1 to R4) connected in series.

Four different gradation voltages are generated by the four resistors (R1 to R4) of the second D/A conversion circuit based on the gradation voltages supplied to the first output line (H) 108-1 and the first output line (L) 108-2.

Accordingly, after the switch circuit swD is closed and a voltage close to the corresponding gradation voltage is supplied to the second output lines beforehand, the switch circuit swD is opened and either one of the internal switches (swC1 to swC4) of the switch circuit swC is closed, whereby the corresponding gradation voltage is supplied to the second output lines 115. The gradation voltage supplied to the second output lines 115 is further supplied to the source signal lines 117 via a buffer (not illustrated) or the like.

In the present embodiment, the voltage to be supplied to the first output line (L) 108-2 is supplied to the second output lines in order to reduce power consumption beforehand. However, the present invention is not limited to such a case. It is possible to design the circuit so that a voltage to be supplied to the first output line (H) 108-1 is supplied to the second output lines beforehand and the voltage applied via the resistors is subtracted therefrom to thereby obtain the true gradation voltage.

In the present embodiment, the 4-bit digital signal is divided into the upper 2 bits and the lower 2 bits so that each of these two portions of the digital signal is used to control the switching operations of the switch circuits swA, swB and swC. However, the dividing manner of the 4-bit digital signal is not limited to the above case.

For example, upper 3 bits can be used for control switching of the switch circuits swA and swB, while the least significant 1 bit can be used for control the switching of the switch circuit swC. In this case, the number of internal switches of both the switch circuits swA and swB is 8 (swA1 to swA8, swB1 to swB8), and the number of gradation voltage lines is 9 (V0 to V8). In addition, the number of internal switches of the switch circuit swC is 2 (swC1 and swC2), and the number of resistors is 2 (R1 and R2). After the switch circuit swD is closed and a voltage close to the corresponding gradation voltage is supplied to the second output lines beforehand, the switch circuit swD is opened and 3-bit digital signal is input to the switch circuit swA. One of the eight internal switches of the switch circuit swA is thus closed to select one of the gradation voltage lines, and the voltage thereof is supplied to the first output line (H). Similarly, after the switch circuit swD is closed and a voltage close to the corresponding gradation voltage is supplied to the second output lines beforehand, the switch circuit swD is opened and 3-bit digital signal is input to the switch circuit swB. One of the eight internal switches of the switch circuit swB is thus closed to select one of the gradation voltage lines, and the voltage thereof is supplied to the first output line (L). Furthermore, 1-bit digital signal is input to the switch circuit swC. One of the two internal switches of the switch circuit swC is thus closed so that the corresponding gradation voltage is supplied to the second output lines. The gradation voltage supplied to the second output lines is further supplied to the source signal lines via a buffer or the like.

Although the D/A conversion circuit for handling 4-bit digital signal has been described in the present embodiment, in accordance with the present invention, the D/A conversion circuit for handling n-bit digital signal (n is a natural number that is equal to or larger than 2) can be realized. In such a case, the n-bit digital signal can be divided into upper x bit(s) and lower y bit(s) (where x+y=n). In this case, the number of internal switches of the switch circuit swA is $2^x$ (swA1 to swA$2^x$), the number of internal switches of the switch circuit swB is similarly $2^x$ (swB1 to swB$2^x$), and the number of gradation voltage lines is $2^x+1$. In addition, the number of internal switches of the switch circuit swC is $2^y$ (swC1 to swC$2^y$), and the number of resistors is $2^y$ (R1 to R2).

Hereinbelow, a method for manufacturing an active matrix type liquid crystal display device including a D/A conversion circuit in accordance with the present embodiment will be described. It should be noted that the manufacturing method below is merely one embodiment of the present invention, and therefore, the D/A conversion circuit of the present invention can be manufactured in accordance with any different manufacturing method.

More specifically, a method for manufacturing pixel TFTs in a display region and TFTs of a driver circuit to be provided in the vicinity of the display region on the identical substrate will be described in detail. For the purpose of simplicity, a CMOS circuit as a fundamental circuit of a shift register circuit, a buffer circuit or the like in a control circuit, as well as an n-channel TFT for forming a sampling circuit, will be illustrated.

In FIG. 6A, a low-alkaline glass substrate or a quartz substrate can be used as a substrate 601. In this embodiment, a low-alkaline glass substrate is used. In this case, a heat treatment at a temperature lower by about 10 to 20° C. than the strain point of glass may be performed in advance. On the surface of this substrate 601 on which TFTs are to be formed, a base film 602 such as a silicon oxide film, a silicon nitride film or a silicon oxynitride film is formed in order to prevent the diffusion of impurities from the substrate 601. For example, a lamination of a silicon oxynitride film which is fabricated from $SiH_4$, $NH_3$, $N_2O$ by, e.g., by plasma CVD into 100 nm thick and a silicon oxynitride film which is similarly fabricated from $SiH_4$ and $N_2O$ into 200 nm thick are formed.

Next, a semiconductor film 603a that has an amorphous structure and a thickness of 20 to 150 nm (preferably, 30 to 80 nm) is formed by a known method such as plasma CVD or sputtering. In this embodiment, an amorphous silicon film is formed to a thickness of 55 nm by plasma CVD. As semiconductor films which have an amorphous structure, there are an amorphous semiconductor film and a microcrystalline semiconductor film; and a compound semiconductor film with an amorphous structure such as an amorphous silicon germanium film may also be applied. Further, the ground film 602 and the amorphous silicon film 603a can be formed by the same deposition method, so that the two films can be formed in succession. By not exposing the base film to the atmospheric air after the formation of the base film, the surface of the base film can be prevented from being contaminated, as a result of which the dispersion in characteristics of the fabricated TFTs and the variation in the threshold voltage thereof can be reduced. (FIG. 6A)

Then, by a known crystallization technique, a crystalline silicon film 603b is formed from the amorphous silicon film 603a. For example, a laser crystallization method or a thermal crystallization method (solid phase growth method) may be applied, however, here, in accordance with the technique disclosed in Japanese Patent Laid-Open No. Hei 7-130652, the crystalline silicon film 603b is formed by the crystallization method using a catalytic element. It is preferred that, prior to the crystallization step, heat treatment is carried out at 400 to 500° C. for about one hour though it depends on the amount of hydrogen contained, so that, after the amount of hydrogen contained is reduced to 5 atomic % or less, the crystallization is carried out. The atoms are subjected to re-configuration to become dense when an amorphous silicon film is crystallized; and therefore, the thickness of the crystalline silicon film fabricated is reduced by about 1 to 15% than the initial thickness of the amorphous silicon film (55 nm in this embodiment). (FIG. 6B)

Then, the crystalline silicon film 603b is divided into island-shaped portions, whereby island semiconductor layers 604 to 607 are formed. Thereafter, a mask layer 608 of a silicon oxide film is formed to a thickness of 50 to 100 nm by plasma CVD or sputtering. (FIG. 6C)

Then, a resist mask 609 is provided, and, into the whole surfaces of the island semiconductor layers 605 to 607 forming the n-channel type TFTs, boron (B) is added as an impurity element imparting p-type conductivity, at a concentration of about $1\times10^{16}$ to $5\times10^{17}$ atoms/cm$^3$, for the purpose of controlling the threshold voltage. The addition of boron (B) may be effected either by the ion doping or it may be added simultaneously when the amorphous silicon film is formed. The addition of boron (B) here is not always necessary, however, the formation of semiconductor layers 610 to 612 into which boron is added is preferable for maintaining the threshold voltage of the n-channel type TFTs within a prescribed range. (FIG. 6D)

In order to form the LDD regions of the n-channel type TFTs in the driving circuit, an impurity element imparting n-type conductivity is selectively added to the island semiconductor layers 610 and 611. For this purpose, resist masks 613 to 616 are formed in advance. As the impurity element imparting the n-type conductivity, phosphorus (P) or arsenic (As) may be used; here, in order to add phosphorus (P), ion doping using phosphine (PH$_3$) is applied. The concentration of phosphorus (P) in the impurity regions 617 and 618 thus formed may be set within the range of from 2×10$^{16}$ to 5×10$^{19}$ atoms/cm$^3$. In this specification, the concentration of the impurity element contained in the thus formed impurity regions 617 to 619 imparting n-type conductivity is represented by (n$^-$). Further, the impurity region 619 is a semiconductor layer for forming the storage capacitor of the display region; into this region, phosphorus (P) is also added at the same concentration. (FIG. 7A)

Next, the mask layer 608 is removed by hydrofluoric acid or the like, and the step of activating the impurity elements added at the steps shown in FIG. 6D and FIG. 7A is carried out. The activation can be carried out by performing heat treatment in a nitrogen atmosphere at 500 to 600° C. for 1 to 4 hours or by using the laser activation method. Further, both methods may be used together. In this embodiment, the laser activation method is employed, that is, a linear beam is formed using a KrF excimer laser beam (with a wavelength of 248 nm); and then the entire surface of the substrate on which island semiconductor layers are formed is treated by scanning the beam of the oscillation frequency at 5 to 50 Hz, the energy density at 100 to 500 mJ/cm$^2$, and the overlap ratio of the linear beam at 80 to 98%. Any item of the laser irradiation condition is subjected to no limitation, so that the operator may suitably select the condition.

Then, a gate insulating film 620 is formed of an insulating film including silicon to a thickness of 10 to 150 nm, by plasma CVD or sputtering. For example, a silicon oxynitride film is formed to a thickness of 120 nm. As the gate insulating film, another insulating film including silicon may be used as a single layer or a laminate structure. (FIG. 7B)

Next, in order to form a gate electrode, a first conductive layer is deposited. This first conductive layer may be comprised of a single layer but may also be comprised of a laminate consisting of two or three layers. In this embodiment, a conductive layer (A) 621 comprising a conductive metal nitride film and a conductive layer (B) 622 comprising a metal film are laminated. The conductive layer (B) 622 may be formed of an element selected from among tantalum (Ta), titanium (Ti), molybdenum (Mo) and tungsten (W) or an alloy comprised mainly of the above-mentioned element, or an alloy film (typically, an Mo—W alloy film or an Mo—Ta alloy film) comprised of a combination of the above-mentioned elements, while the conductive layer (A) 621 comprises tantalum nitride (TaN), tungsten nitride (WN), titanium nitride (TiN), or molybdenum nitride (MoN). Further, as the substitute materials of the conductive film (A) 621, tungsten silicide, titanium silicide, and molybdenum silicide may also be applied. The conductive layer (B) may preferably have its impurity concentration reduced in order to decrease the resistance thereof, in particular, as for the oxygen concentration, the concentration may be set to 30 ppm or less. For example, tungsten (W) could result in realizing a resistivity of 20 μΩcm or less by rendering the oxygen concentration thereof to 30 ppm or less.

The conductive layer (A) 621 may be set to 10 to 50 nm (preferably, 20 to 30 nm), and the conductive layer (B) 622 may be set to 200 to 400 nm (preferably, 250 to 350 nm). In this embodiment, as the conductive layer (A) 621, a tantalum nitride film having a thickness of 30 nm is used, while, as the conductive layer (B) 622, a Ta film having a thickness of 350 nm is used, both films being formed by sputtering. In case of performing sputtering here, if a suitable amount of Xe or Kr is added into the sputtering gas Ar, the internal stress of the film formed is alleviated, whereby the film can be prevented from peeling off. Though not shown, it is effective to form a silicon film, into which phosphorus (P) is doped, to a thickness of about 2 to 20 nm underneath the conductive layer (A) 621. By doing so, the adhesiveness of the conductive film formed thereon can be enhanced, and at the same time, oxidation can be prevented. In addition, the alkali metal element slightly contained in the conductive film (A) or the conductive film (B) can be prevented from diffusing into the gate insulating film 620. (FIG. 7C)

Next, resist masks 623 to 627 are formed, and the conductive layer (A) 621 and the conductive layer (B) 622 are etched together to form gate electrodes 628 to 631 and a capacitor wiring 632. The gate electrodes 628 to 631 and the capacitor wiring 632 are formed in such a manner that the layers 628a to 632a comprised of the conductive layer (A) and the layers 628b to 632b comprised of the conductive layer (B) are formed as one body respectively. In this case, the gate electrodes 629 and 630 formed in the driving circuit are formed so as to overlap the portions of the impurity regions 617 and 618 through the gate insulating film 620. (FIG. 7D)

Then, in order to form the source region and the drain region of the p-channel TFT in the driving circuit, the step of adding an impurity element which imparts p-type conductivity is carried out. Here, by using the gate electrode 628 as a mask, impurity regions are formed in a self-alignment manner. In this case, the region in which the n-channel TFT will be formed is covered with resist mask 633 in advance. Impurity regions 634 are formed by ion doping using diborane (B$_2$H$_6$). The concentration of boron (B) in this region is brought to 3×10$^{20}$ to 3×10$^{21}$ atoms/cm$^3$. In this specification, the concentration of the impurity element which imparts p-type contained in the impurity regions 634 is represented by (p$^+$). (FIG. 8A)

Next, in the n-channel TFTs, impurity regions that functioned as source regions or drain regions are formed. Resist masks 635 to 637 are formed, an impurity element for imparting the n-type conductivity is added to form impurity regions 638 to 642. This is carried out by ion doping using phosphine (PH$_3$), and the phosphorus (P) concentration in these regions is set to 1×10$^{20}$ to 1×10$^{21}$ atoms/cm$^3$. In this specification, the concentration of the impurity element imparting the n-type contained in the impurity regions 638 to 642 formed here is represented by (n$^+$) (FIG. 8B)

In the impurity regions 638 to 642, the phosphorus (P) or boron (B) which is added at the preceding steps are contained, however, as compared with this impurity element concentration, phosphorus is added here at a sufficiently high concentration, so that the influence by the phosphorus (P) or boron (B) added at the preceding steps need not be taken into consideration. Further, the concentration of the phosphorus (P) that is added into the impurity regions 638 is half to one-third of the concentration of the boron (B) added at the step shown in FIG. 8A; and thus, the p-type conductivity is secured, and no influence is exerted on the characteristics of the TFTs.

Then, the step of adding an impurity imparting n-type for formation of the LDD regions of the n-channel type TFT in the display region is carried out. Here, by using the gate electrode 631 as a mask, the impurity element for imparting n-type is added in a self-alignment manner. The concentration of phosphorus (P) added is 1×10$^{16}$ to 5×10$^{18}$ atoms/cm$^3$; by thus adding phosphorus at a concentration lower than the concentrations of the impurity elements added at the steps shown in FIG. 7A, FIG. 8A and FIG. 8B, only impurity regions 643 and 644 are substantially formed. In this specification, the concentration of the impurity element for imparting the n conductivity type which impurity element is contained in these impurity regions 643 and 644 is represented by (n⁻). (FIG. 8C)

Thereafter, in order to activate the impurity elements, which are added at their respective concentrations for imparting n-type or p-type conductivity, a heat treatment step is carried out. This step can be carried out by furnace annealing, laser annealing or rapid thermal annealing (RTA). Here, the activation step is performed by furnace annealing. Heat treatment is carried out in a nitrogen atmosphere with an oxygen concentration of 1 ppm or less, preferably 0.1 ppm or less, at 400 to 800° C., generally at 500 to 600° C.; in this embodiment, the heat treatment is carried out at 550° C. for 4 hours. Further, in the case a substrate such as a quartz substrate which has heat resistance is used as the substrate 601, the heat treatment may be carried out at 800° C. for one hour; in this case, the activation of the impurity elements and the junctions between the impurity regions into which the impurity element is added and the channel forming region could be well formed.

By this heat treatment, on the metal films 628b to 632b, which form the gate electrodes 628 to 631 and the capacitor wiring 632, conductive layers (C) 628c to 632c are formed with a thickness of 5 to 80 nm as measured from the surface. For example, in the case the conductive layers (B) 628b to 632b are made of tungsten (W), tungsten nitride (WN) is formed; in the case of tantalum (Ta), tantalum nitride (TaN) can be formed. Further, the conductive layers (C) 628c to 632c can be similarly formed by exposing the gate electrodes 628 to 631 to a plasma atmosphere containing nitrogen (for example, plasma atmosphere contains nitrogen or ammonia). Further, heat treatment is carried out in an atmosphere containing 3 to 100% of hydrogen at 300 to 450° C. for 1 to 12 hours, thus performing the step of hydrogenating the island semiconductor layers. It is a step for terminating the dangling bonds of the semiconductor layers by the thermally excited hydrogen. As another means for the hydrogenation, plasma hydrogenation (using the hydrogen excited by plasma) may be performed.

In the case the island semiconductor layers are fabricated by the crystallization method using a catalytic element from an amorphous silicon film, a very small amount of the catalytic element remained in the island semiconductor layers. Of course, it is possible to complete the TFT even in such a state, however, it is more preferable to remove the residual catalytic element at least from the channel forming region. As one of the means for removing this catalytic element, there is the means utilizing the gettering function of phosphorus (P). The concentration of phosphorus (P) necessary to perform gettering is at the same level as that of the impurity region (n⁺) which is formed at the step shown in FIG. 8B; by the heat treatment at the activation step carried out here, the catalytic element could be gathered from the channel forming region of the n-channel type and the p-channel type TFTs. (FIG. 8D)

Figure 11A:
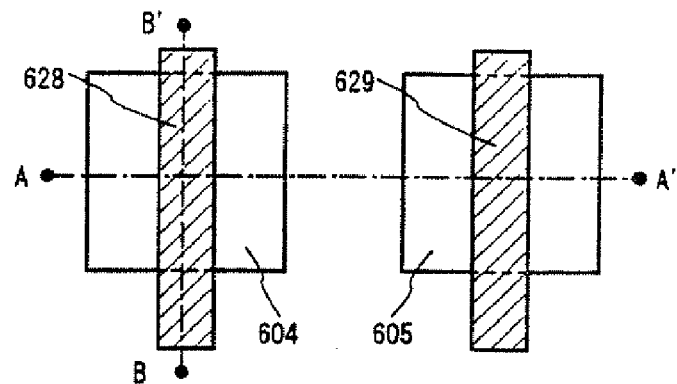
FIGS. 11A to 11C show plane views illustrating manufacturing steps of a pixel TFT, a holding capacitor, and a TFT in a driver circuit.
Figure 11B:
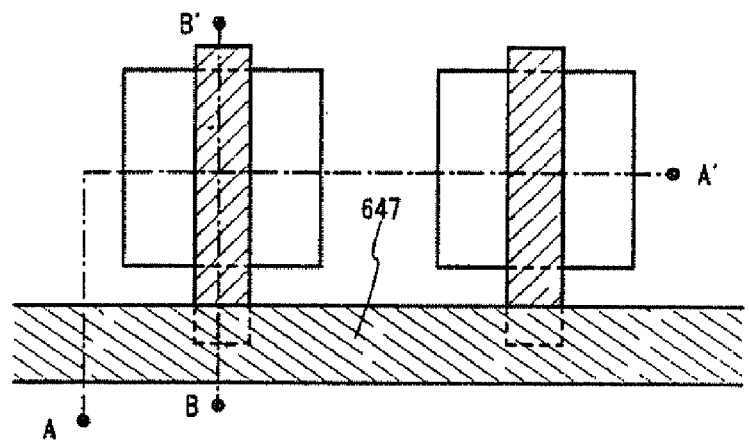
Figure 11C:
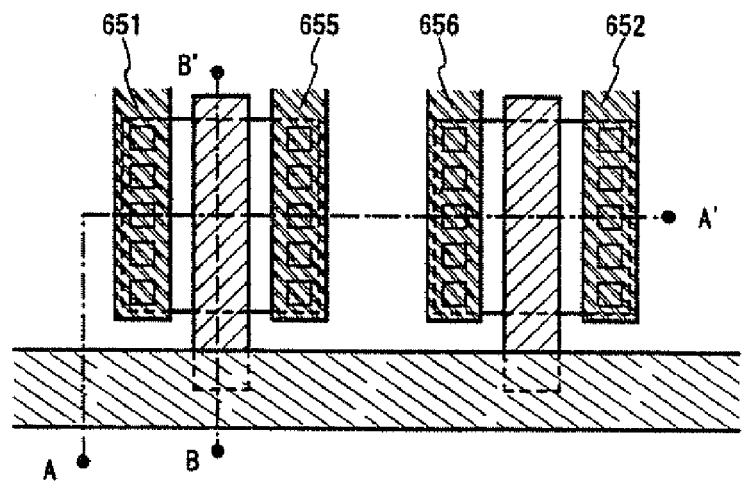
Figure 12A:
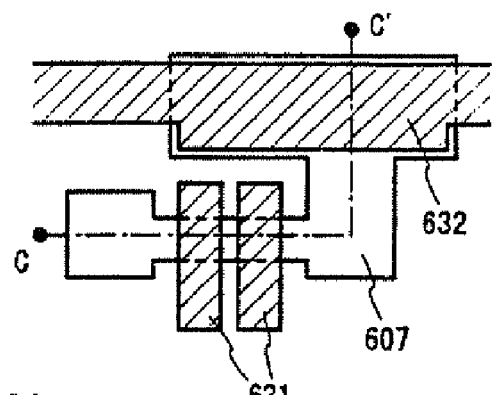
FIGS. 12A to 12C show top views illustrating manufacturing steps of a pixel TFT, a holding capacitor, and a TFT in a driver circuit.

FIGS. 11A and 12A are top views of the TFT up to the processes at this point and the cross sections A-A' and C-C' correspond to A-A' and C-C' of FIG. 8D. In addition, cross sections B-B' and D-D' correspond to the cross sectional diagrams of FIGS. 8A and 9A. Top views of FIGS. 11 and 12 omit gate insulating films, however, they are formed so as to at least show gate electrodes 628 to 631 and capacitor wiring 632 formed over island semiconductor layers 604 to 607 in the processes thus far.

After the activation and hydrogenation steps, a second conductive film is formed as gate wiring. This second conductive film is preferably formed of a conductive layer (D) comprised mainly of aluminum (Al) or copper (Cu) that is a low resistance material, and a conductive layer (E) comprised of titanium (Ti), tantalum (Ta), tungsten (W), or molybdenum (Mo). In this embodiment, the second conductive film is formed by using, as the conductive layer (D) 645, an aluminum (Al) film containing 0.1 to 2 wt % of titanium (Ti) and by using a titanium (Ti) film as the conductive layer (E) 646. The conductive layer (D) 645 may be formed to a thickness of 200 to 400 nm (preferably, 250 to 350 nm), while the conductive layer (E) 646 may be formed to a thickness of 50 to 200 nm (preferably, 100 to 150 nm). (FIG. 9A)

Then, in order to form gate wirings connected to the gate electrodes, the conductive layer (E) 646 and the conductive layer (D) 645 are etched, whereby gate wirings 647 and 648 and a capacitor wiring 649 are formed. The etching treatment is carried out in such a manner that, at first, by the dry etching using a mixture gas consisting of $SiCl_4$, $Cl_2$ and $BCl_3$, the portions extending from the surface of the conductive layer (E) to a part of the way of the conductive layer (D) are removed, and, thereafter, the conductive layer (D) is removed by the wet etching using a phosphoric acid etching solution, whereby the gate wirings could be formed, maintaining a selective workability with respect to the base film.

Figure 12B:
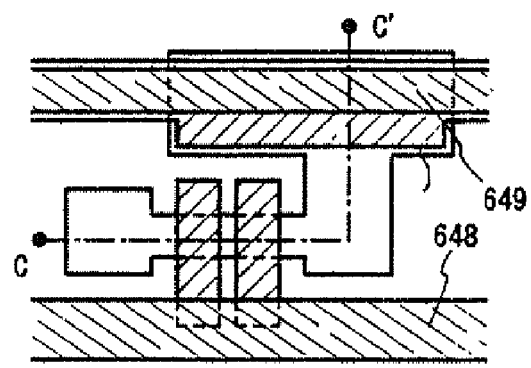

FIGS. 11B and 12B show top views of this state, and cross sections A-A' and C-C' correspond to A-A' and C-C' of FIG. 9B. In FIGS. 11B and 12B, a part of the gate wirings 647 and 648 overlap a part of the gate electrodes 628, 629 and 631 and they are electrically connected. Such state is also clear from cross sectional views of FIGS. 8B and 9B which correspond to cross sections B-B' and D-D'. The conductive layer (C) which forms the first conductive layer and the conductive layer (D) which forms the second conductive layer are electrically connected.

A first interlayer insulating film 650 is formed of a silicon oxide film or a silicon oxynitride film having a thickness of 500 to 1500 nm, and contact holes reaching the source regions or the drain regions, which are formed in the respective island semiconductor layers, are formed; and source wirings 651 to 654 and drain wirings 655 to 658 are formed. Though not shown, in this embodiment, these electrodes are formed from a three-layer structure which is constituted by continuously forming a Ti film having a thickness of 100 nm, an aluminum film containing Ti and having a thickness of 300 nm, and a Ti film having a thickness of 150 nm by the sputtering method.

Next, as a passivation film 659, a silicon nitride film, a silicon oxide film or a silicon oxinitride film is formed to a thickness of 50 to 500 nm (typically, 100 to 300 nm). In the case that a hydrogenating treatment is carried out in this state, a desirable result is obtained in respect of the enhancement in characteristics of the TFTs. For example, it is preferable to carry out heat treatment in an atmosphere containing 3 to 100% of hydrogen at 300 to 450° C. for 1 to 12 hours; or, in the case that the plasma hydrogenation method is employed, a similar effect is obtained. Here, openings may be formed in the passivation film 659 at the positions at which contact holes for connecting the pixel electrodes and drain wirings to each other will be formed later. (FIG. 9C)

Figure 12C:
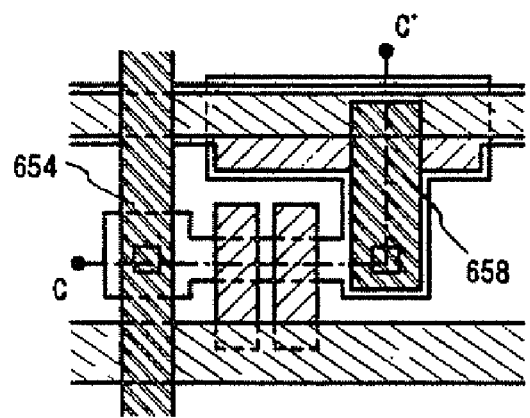

FIGS. 11C and 12C show top views of this state and cross sections A-A' and C-C' correspond to A-A' and C-C' of FIG. 9C. FIGS. 11C and 12C omit the first interlayer insulating film, but source wirings 651, 652 and 654 and drain wirings 655, 656 and 658 are connected to the source and drain regions (not shown) formed in the island semiconductor layers 604, 605 and 607 through contact holes formed in the first interlayer insulating film.

Figure 10:
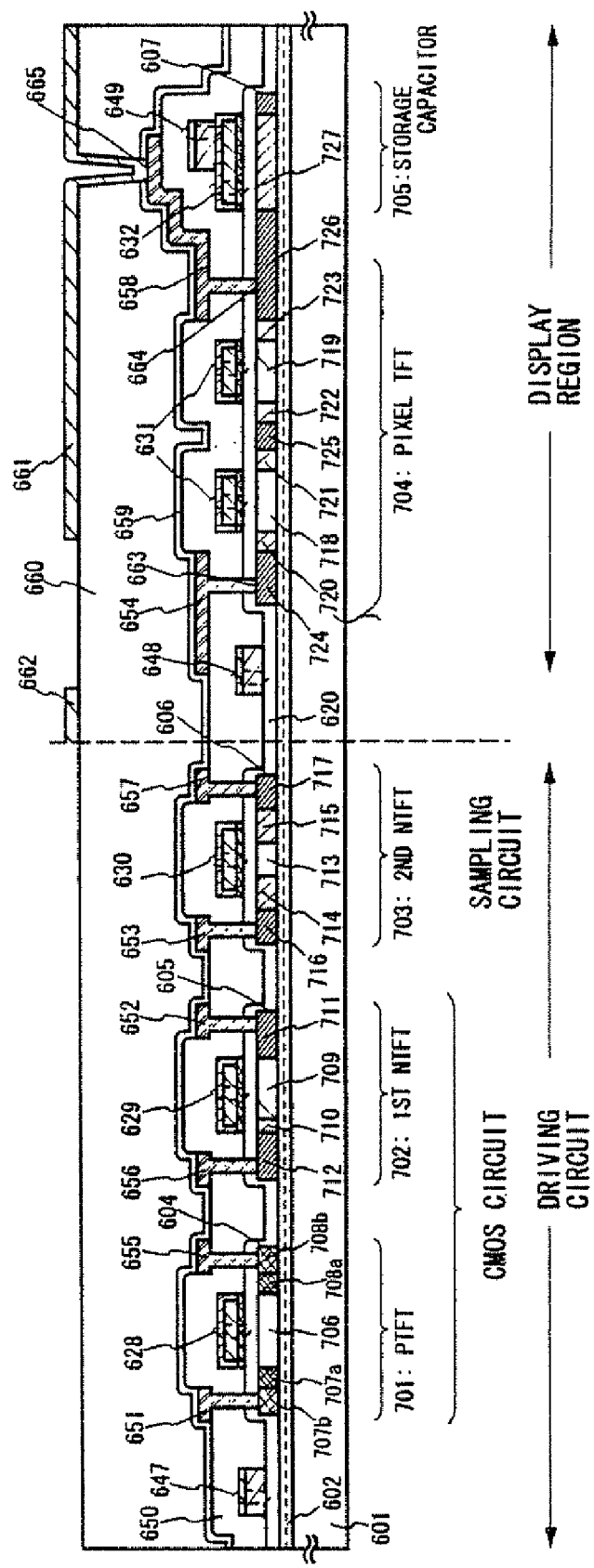
FIG. 10 shows a cross-sectional view of a pixel TFT, a holding capacitor, and a TFT in a driver circuit.

Thereafter, a second interlayer insulating film 660 comprising an organic resin is formed to a thickness of 1.0 to 1.5 µm. As the organic resin, polyimide, acrylic, polyamide, polyimideamide, or BCB (benzocyclobutene), etc., can be used. Here, polyimide of the type that, after applied to the substrate, thermally polymerizes is used; it is fired at 300° C., whereby the second interlayer dielectric film is formed. Then, a contact hole reaching the drain wiring 658 is formed in the second interlayer insulating film 660, and pixel electrodes 661 and 662 are formed. The pixel electrodes can be formed by using a transparent conductive film in the case a transmission type liquid crystal panel is to be obtained, while, in the case a reflection type liquid crystal panel is to be fabricated, the pixel electrodes can be formed by a metal film. In this embodiment, a transmission type liquid crystal panel is to be fabricated, so that an indium tin oxide (ITO) film is formed to a thickness of 100 nm by the sputtering method. (FIG. 10)

In this way, a substrate having the TFTs of the driving circuit and the pixel TFTs of the display region on the same substrate could be completed. In the driving circuit, there are formed a p-channel TFT 701, a first n-channel TFT 702 and a second n-channel TFT 703, while, in the display region, there are formed a pixel TFT 704 and a storage capacitor 705. In this specification, such a substrate is called active matrix substrate for convenience.

The p-channel TFT 701 in the driving circuit has a channel forming region 706, source regions 707a and 707b and drain regions 708a and 708b in the island semiconductor layer 604. The first n-channel TFT 702 has a channel forming region 709, an LDD region 710 overlapping the gate electrode 629 (such an LDD region will hereinafter be referred to as Lov), a source region 711 and a drain region 712 in the island semiconductor layer 605. The length in the channel direction of this Lov region is set to 0.5 to 3.0 μm, preferably 1.0 to 1.5 μm. A second n-channel TFT 703 has a channel forming region 713, LDD regions 714 and 715, a source region 716 and a drain region 717 in the island semiconductor layer 606. As these LDD regions, there are formed an Lov region and an LDD region which does not overlap the gate electrode 630 (such an LDD region will hereafter be referred as Loff); and the length in the channel direction of this Loff region is 0.3 to 2.0 μm, preferably 0.5 to 1.5 μm. The pixel TFT 704 has channel forming regions 718 and 719, Loff regions 720 to 723, and source or drain regions 724 to 726 in the island semiconductor layer 607. The length in the channel direction of the Loff regions is 0.5 to 3.0 μm, preferably 1.5 to 2.5 μm. Further, the storage capacitor 705 comprises capacitor wirings 632 and 649, an insulating film composed of the same material as the gate insulating film and a semiconductor layer 727 which is connected to the drain region 726 of the pixel TFT 704 and in which an impurity element for imparting the n conductivity type is added. In FIG. 10, the pixel TFT 704 is of the double gate structure, but may be of the single gate structure, or may be of a multi-gate structure in which a plurality of gate electrodes are provided.

Figure 13:
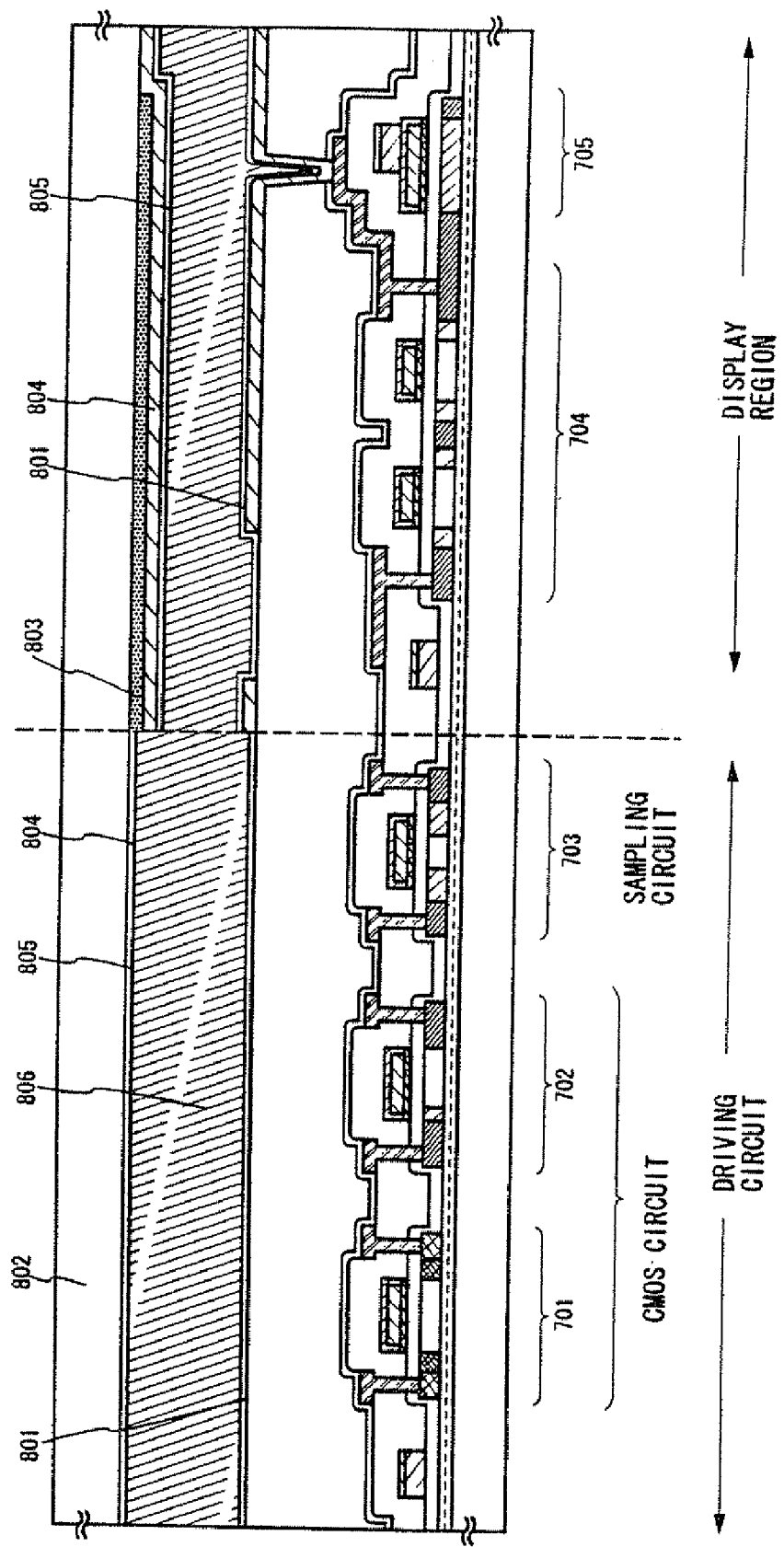
FIG. 13 shows a cross-sectional view of a liquid crystal display device.

Process for forming an active matrix liquid crystal display device shown in FIG. 13 from an active matrix substrate formed through the above process is next described.

An alignment film 801 is formed on an active matrix substrate of the state of FIG. 10. An opposing substrate 802 is next prepared. The opposing substrate comprises a shielding film 803, an opposing electrode 804 and an alignment film 805.

Note that a polyimide film is used for the alignment film in this embodiment so that the liquid crystal molecules orient in parallel with respect to the substrate. By performing rubbing treatment after forming an alignment film, the liquid crystal molecules are made to orient in parallel having a determined pre-tilt angle.

The active matrix substrate that when through the above processes and the opposing substrate are stuck together through sealant (not shown) and spacers, etc., by a known cell assembly process. Thereafter liquid crystal material 806 is injected between the two substrates and completely sealed by a sealant. Thus an active matrix liquid crystal display device is completed.

In the present embodiment, the liquid crystal panel is designed to operate in a TN (Twisted Nematic) mode. Accordingly, a pair of polarizing plates are arranged so as to interpose the liquid crystal panel therebetween in a crossed Nicols condition (in which polarizing axes of the pair of polarizing plates are disposed perpendicularly to each other).

Accordingly, it can be understood that the liquid crystal display device in the present embodiment operates in the so-called normally white mode in which the white display is obtained without voltage application.

In the liquid crystal panel in the present embodiment, only one end surface of the active matrix substrate to which an FPC is attached is exposed outward. The remaining three end surfaces of the active matrix substrate are aligned with those of the opposing substrate.

It will be understood that in accordance with the manufacturing method as described above, the D/A conversion circuit of the present invention can be manufactured, on an insulating substrate such as a quartz substrate, a glass substrate or the like, integrally with other driver circuits and other peripheral devices to be included in the active matrix type liquid crystal display device.

As described above, the D/A conversion circuit in accordance with the present invention can exhibit various features, and can provide a bright and fine image through the combined effects of these features, thereby realizing an electro-optical device having satisfactory operating characteristics and high reliability. Furthermore, an electronic equipment of high performances can be obtained in which such an electro-optical device is mounted as a component.

Furthermore, although the present embodiment has been described by taking a liquid crystal display device as an example, the present invention is applicable to other active matrix type display device, such as an EL (Electro-Luminescence) display device, and an EC (Electro-Chromics) display device.

Embodiment 2

In Embodiment 2, another configuration of a D/A conversion circuit in accordance with the present invention will be described. Although an 8-bit D/A conversion circuit will be described in the present embodiment, the present invention is not limited to this case. The present invention can be applied to any D/A conversion circuits for handling a digital signal of 2 bits or more.

The present embodiment describes the D/A conversion circuit to be provided in a driver circuit of a liquid crystal display device having pixels of 1920 (along a horizontal direction)×1080 (along a vertical direction).

Figure 4:
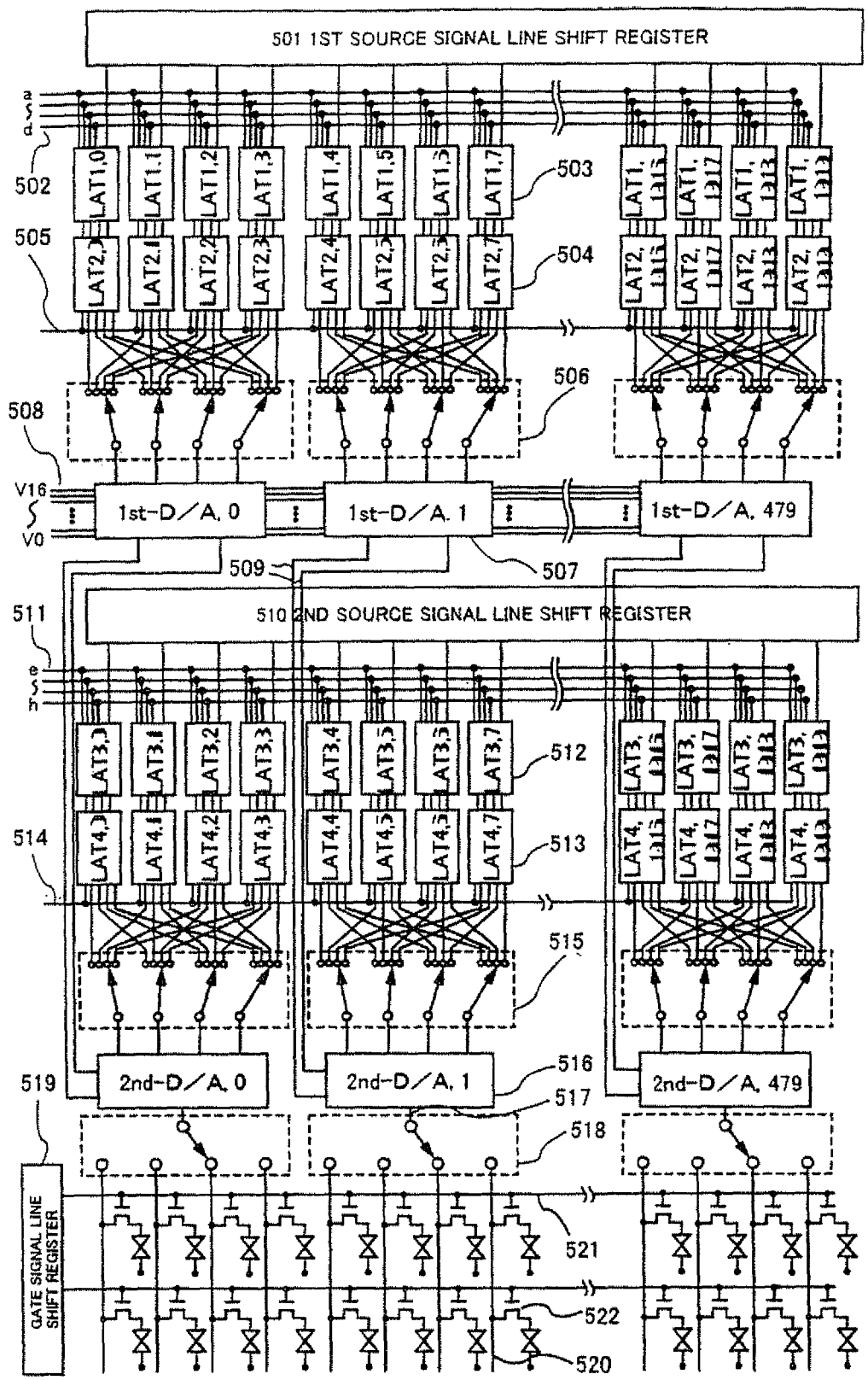
FIG. 4 shows a schematic diagram illustrating the construction of an active matrix type liquid crystal display device including a D/A conversion circuit in accordance with the present invention.

With reference to FIG. 4, FIG. 4 shows a schematic diagram illustrating the construction of a liquid crystal display device in accordance with the present embodiment. The liquid crystal display device in accordance with the present embodiment is composed of various components such as a first source signal line shift register 501, digital decoder address lines (a, b, c, d) 502, latch circuits (LAT1,0 to LAT1, 1919) 503, latch circuits (LAT2,0 to LAT2,1919) 504, a latch pulse line 505, switching circuits 506, first D/A conversion circuits (1st-D/A,0 to 1st-D/A,479) 507, gradation voltage lines (V0 to V16) 508, first output lines 509 (509-1 and 509-2) of the first D/A conversion circuits, a second source signal line shift register 510, digital decoder address lines (e, f, g, h) 511, latch circuits (LAT3,0 to LAT3,1919) 512, latch circuits (LAT4,0 to LAT4,1919) 513, a latch pulse line 514, switching circuits 515, second D/A conversion circuits (2nd-D/A,0 to 2nd-D/A,479) 516, second output lines 517 of the second D/A conversion circuits, switching circuits 518, a gate signal line shift register 519, source signal lines 520, gate signal lines (scanning lines) 521, and pixel TFTs 522.

Among a 8-bit digital signal to be externally supplied, the upper 4 bits are supplied to the address lines a, b, c and d, respectively, while the lower 4 bits are supplied to the address lines e, f, g and h, respectively.

Voltages of different levels are supplied to the respective seventeen gradation voltage lines (V0-V16) 508 by dividing a voltage to be applied across the V0 to V16 by way of resistors. In particular, the higher voltage is applied to the V16, as compared to V0. Thus, similar as in Embodiment 1, voltage levels to be applied increase from the V0 towards the V16.

The first source signal line shift register 501 supplies latch signals sequentially to the latch circuits 503 (LAT1,0 to LAT1,1919). The latch circuits 503 receive digital signals from the address lines 502 (*a, b, c, d*) at the timings when the latch signals are to be input, and hold the received digital signals. Furthermore, latch signals are supplied to the latch circuits 504 (LAT2,0 to LAT2,1919), and the digital signals are provided to the latch circuits 504 from the latch circuits 503 and held therein. These steps are similar to the corresponding steps in Embodiment 1, and therefore, the descriptions thereof are omitted here.

The 4-bit digital signal received by and held in the latch circuits 504 (LAT2,0 to LAT2,1919) is input to the switching circuits 506. In the present embodiment, the respective first and second D/A conversion circuits 501 and 510 are provided for every 4 source signal lines. Accordingly, selection of the latch circuits has to be conducted by the switching circuits 506. In an actual operation, each of the latch circuits is selected for a quarter of the one line period. Details of operations of the switching circuits 506 are described in Example 1 of Japanese Patent Application No. Hei 9-286098 filed by the same applicant.

Since a pair of the D/A conversion circuits (the first and second D/A conversion circuits) is provided for every four source signal lines, each of the four latch circuits LAT2,0 to 3 is selected by the switching circuits 506 for a quarter of the one line period to supply a 4-bit digital signal to the first D/A conversion circuits (1st-D/A,0).

The 4-bit digital signal is converted into the gradation voltages by the first D/A conversion circuits 507, and supplied to the second D/A conversion circuits 516.

The second source signal line shift register 510 supplies latch signals sequentially to the latch circuits 512 (LAT3,0 to LAT3,1919). The latch circuits 512 receive digital signals from the address lines 511 (*e, f, g, h*) at the timings when the latch signals are input, and hold the received digital signals. Furthermore, latch signals are supplied to the latch circuits 513 (LAT4,0 to LAT4,1919), and the digital signals are provided to the latch circuits 513 from the latch circuits 512 and held therein. These steps are similar to the corresponding steps in Embodiment 1, and therefore, the descriptions thereof are omitted here. The first and second source signal line shift registers respectively transmit the latch signals to the latch circuits 503 (LAT1,0 to LAT1,1919) and the latch circuits 512 (LAT3,0 to LAT3,1919) at the same timings.

The 4-bit digital signal received by and held in the latch circuits (LAT4,0 to LAT4,1919) is input to the switching circuits 515. Selection of the latch circuits is again required to be conducted by the switching circuits 506. Each of the latch circuits is selected for a quarter of the one line period. Thus, the 4-bit digital signal is sequentially received by the second D/A conversion circuits 516 from the latch circuits.

The second D/A conversion circuits 516 supply gradation voltages to the output lines 517, based on the digital signals to be input.

Figure 5:
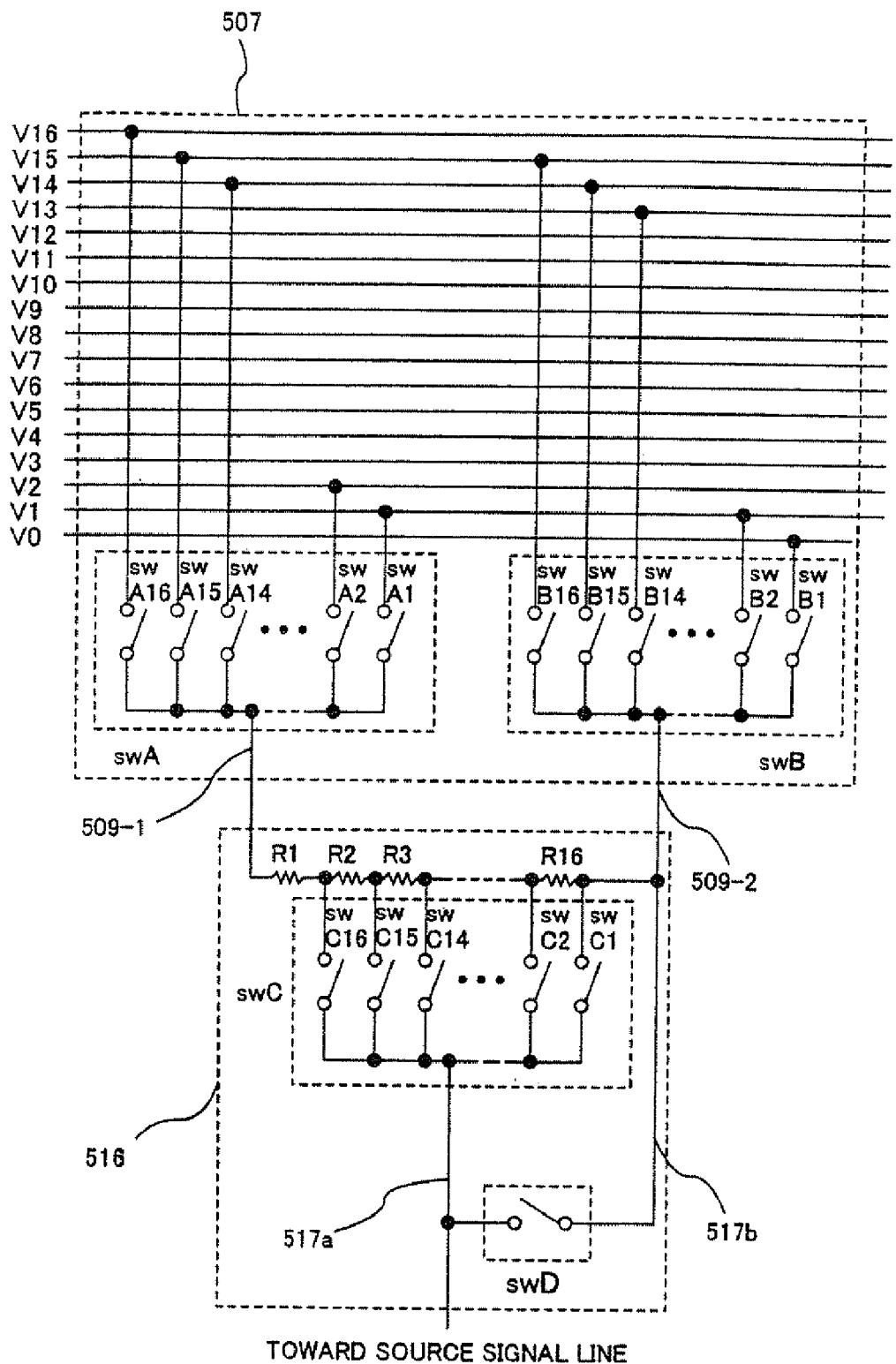
FIG. 5 shows a diagram illustrating the construction of the D/A conversion circuit in accordance with the present invention.

Hereinbelow, the first and second D/A conversion circuits in the present embodiment will be described with reference to FIG. 5. FIG. 5 shows schematic diagrams of the first and second D/A conversion circuits 507 and 516. Operations of the first and second D/A conversion circuits 507 and 516 will be first described with reference to FIG. 5.

The first D/A conversion circuit 507 has a switch circuit swA including 16 internal switches (swA1 to swA16), a switch circuit swB including 16 internal switches (swB1 to swB16), and 17 gradation voltage lines (V0 to V16). The second D/A conversion circuit 516 has a switch circuit swC including 16 internal switches (swC1 to swC16), 16 resistors (R1 to R16), and a switch circuit swD. A resistance value of each of the resistors (R1 to R16) can be designed to be large enough to prevent the device from being damaged by application of a large current between the first output line (H) 509-1 and the first output line (L) 509-2. Such large resistance values will be also advantageous for reducing power consumption. The switch circuit swD is not limited to a specific circuit configuration, so long as it has a switching function. Any inherent resistances of wirings themselves are not considered for simplicity.

In the first D/A conversion circuits 507, the 4-bit digital signal to be supplied from the address lines a, b, c and d via the latch circuits selected by the switching circuits 506 controls the switch circuits swA and swB. In accordance with the digital gradation signals to be supplied from the address lines a, b, c, and d via the latch circuits, either one of the 16 internal switches (swA1 to swA16) in the switch circuit swA is designed to be closed. Two or more internal switches are never closed simultaneously. In addition, in accordance with the digital signals supplied from the address lines a b, c and d via the latch circuits, either one of the 16 internal switches (swB1 to swB16) in the switch circuit swB is designed to be closed. Similarly, two or more internal switches are never closed simultaneously. Furthermore, closing timings for the 4 internal switches (swA1 to swA16) in the switch circuit swA and those of the 4 internal switches (swB1 to swB16) in the switch circuit swB satisfy the following relationship. The internal switch swB1 is closed when the internal switch swA1 is closed, the internal switch swB2 is closed when the internal switch swA2 is closed, the internal switch swB3 is closed when the internal switch swA3 is closed, and the internal switch swB4 is closed when the internal switch swA4 is closed. More generally speaking, the internal switches swA*n* and swB*n* (where n is a natural number in the range of from 1 to 16) are designed to be simultaneously closed. Accordingly, the adjacent two gradation voltage lines are always selected by the switch circuits swA and swB. Thus, the adjacent two gradation voltage lines are selected by the switch circuits swA and swB, and the gradation voltages are supplied to the first output line (H) 509-1 and the first output line (L) 509-2.

In the second D/A conversion circuits 516, the 4-bit digital signal to be supplied from the address lines e, f, g and h via the latch circuits controls the switch circuit swC. In accordance with the digital signals to be supplied from the address lines e, f, g and h via the latch circuits, only one of the 16 internal switches (swC1 to swC16) in the switch circuit swC is designed to be closed.

It should be noted, however, that before the switch circuit swC is closed, the switch circuit swD is closed so that a voltage close to the corresponding gradation voltage is supplied to the source signal lines beforehand. In addition, when the switch circuit swC is closed, the switch circuit swD is designed to be opened at least temporarily. Although not illustrated, a different signal line is provided to which a signal for controlling the turning on/off of the switch circuit swD is applied.

Sixteen different gradation voltages are generated by the 16 resistors (R1 to R16) based on the gradation voltages supplied to the first output line (H) 509-1 and the first output line (L) 509-2. After the switch circuit swD is closed and a voltage close to the corresponding gradation voltage is supplied to the second output lines beforehand, the switch circuit swD is opened and either one of the 16 internal switches of the switch circuit swC is closed, whereby the corresponding gradation voltage is supplied to the second output lines 517. The gradation voltage supplied to the second output lines 517 is further supplied to the source signal lines via a buffer (not illustrated) or the like.

In the present embodiment, the upper 4 bits of the 8-bit digital signal are used to select one of the 16 different gradation voltages, while the lower 4 bits of the same 8-bit digital signal are used to select one of the further 16 different gradation voltages. Accordingly, the total of 256 different gradation voltages (=16 (in connection with the upper 4 bits)×16 (in connection with the lower 4 bits)) can be selected.

Embodiment 3

In Embodiment 3, an example of a D/A conversion circuit that is different from that in Embodiment 1 will be described with reference to FIG. 16. Only a portion of the switch circuits in the circuit configuration in FIG. 16 is different from that in FIG. 3. The same components bear the same reference numerals in these two drawings.

In the circuit configuration shown in FIG. 16, the switch circuit swD can also have a function as one of the internal switches (swC1 to swC4) of the switch circuit swC. In the present embodiment, the switch circuit swD (swC1) shown in FIG. 16 is designed to be turned on/off in accordance with a signal for controlling a timing of the preparatory application of the voltage value close to the true gradation voltage and a signal for controlling timings of the turn-on/off operations of the internal switch swC1. Thus, the number of switching elements to be required can be reduced, thereby resulting in miniaturization of the overall circuit size.

Embodiment 4

In Embodiment 4, an example of a D/A conversion circuit that is different from that in Embodiment 1 will be described with reference to FIG. 17. Only a portion of the switch circuits in the circuit configuration in FIG. 17 is different from that in FIG. 3. The same components bear the same reference numerals in these two drawings.

In the circuit configuration shown in FIG. 17, one of the internal switches (swC1 to swC4) of the switch circuit swC can also has a function as the switch circuit swD. In the present embodiment, the switch circuit swC1 (swD) shown in FIG. 17 is designed to be turned on/off in accordance with a signal for controlling timings of the turn-on/off operations of the internal switch swC1 and a signal for controlling a timing of the preparatory application of the voltage value close to the true gradation voltage. Thus, the number of switching elements to be required can be reduced, thereby resulting in miniaturization of the overall circuit size.

Embodiment 5

Figure 18:
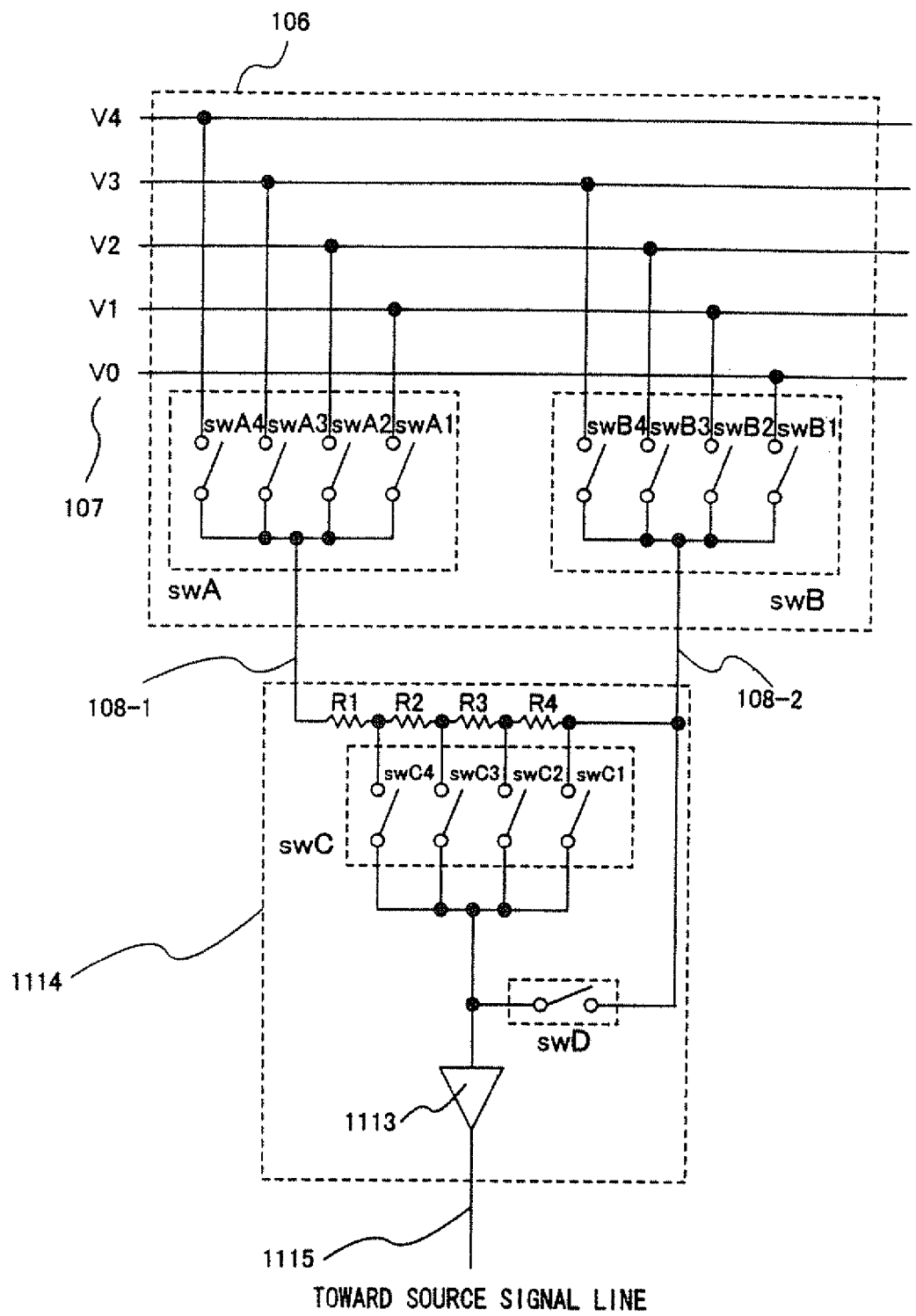
FIG. 18 shows still another exemplary circuit diagram of the D/A conversion circuit in accordance with the present invention.
Figure 19:
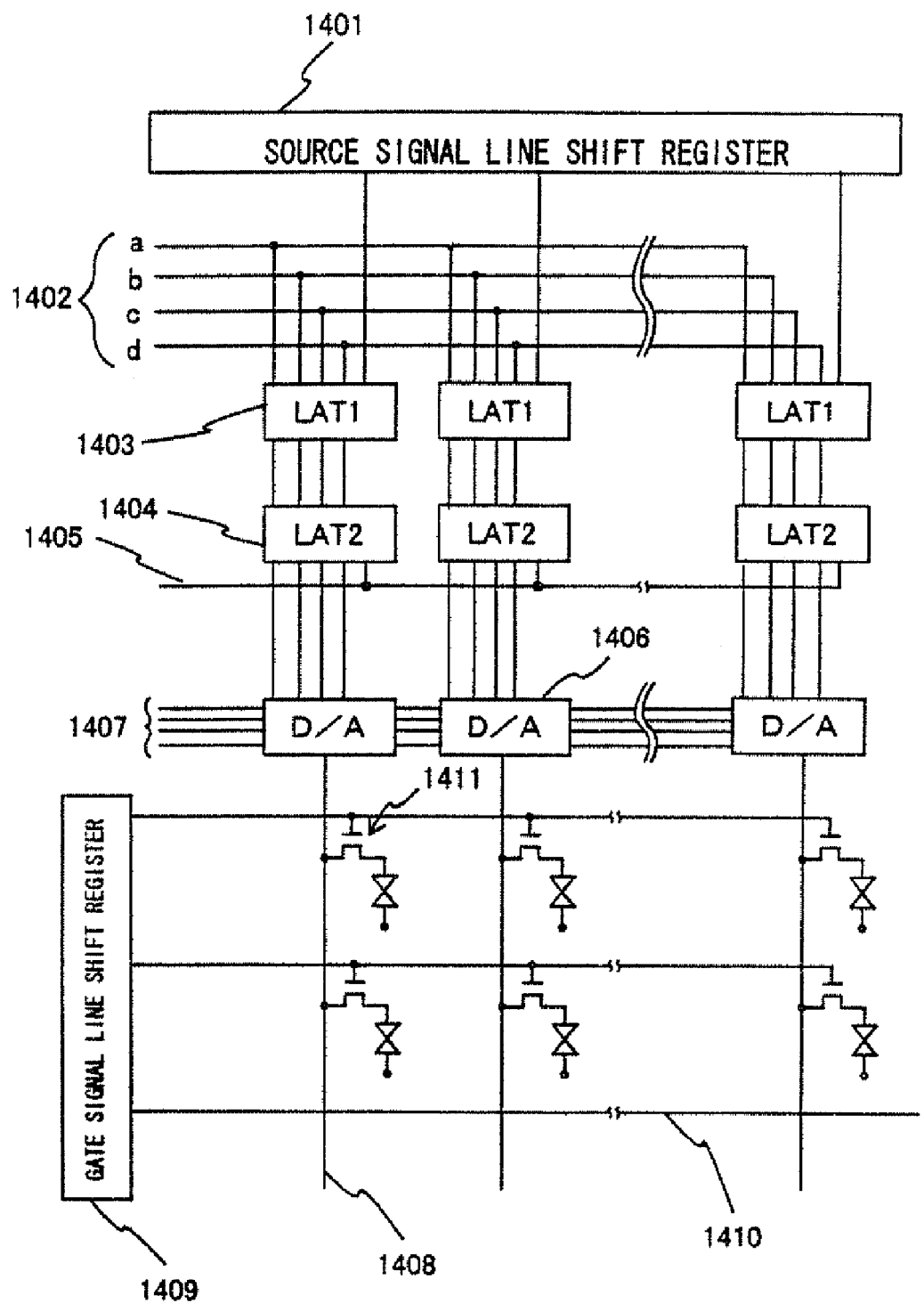
FIG. 19 shows a diagram illustrating the construction of a conventional digital driving type liquid crystal display device.
Figure 20:
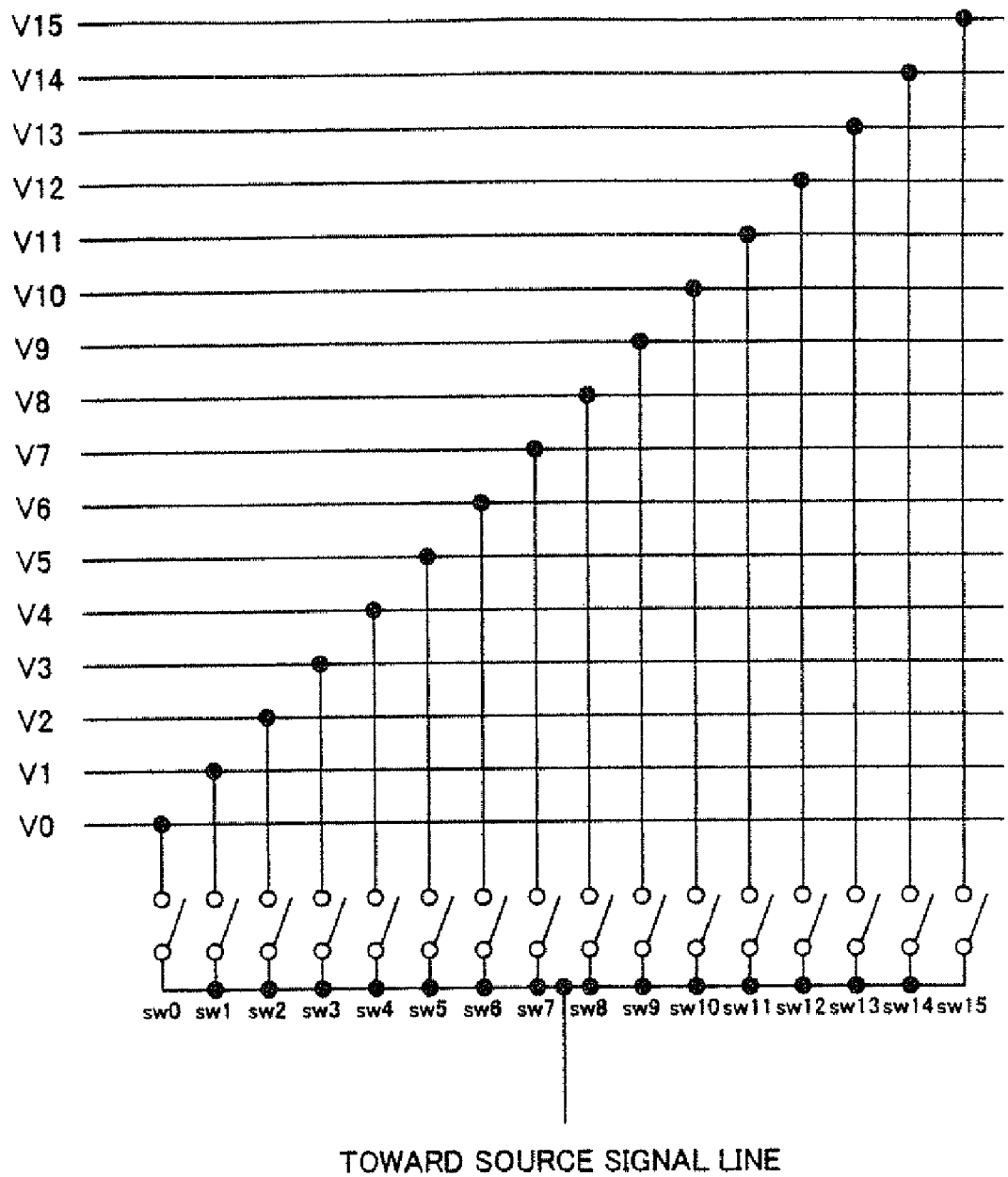
FIG. 20 shows a D/A conversion circuit to be used in the conventional digital driving type liquid crystal display device.
Figure 21:
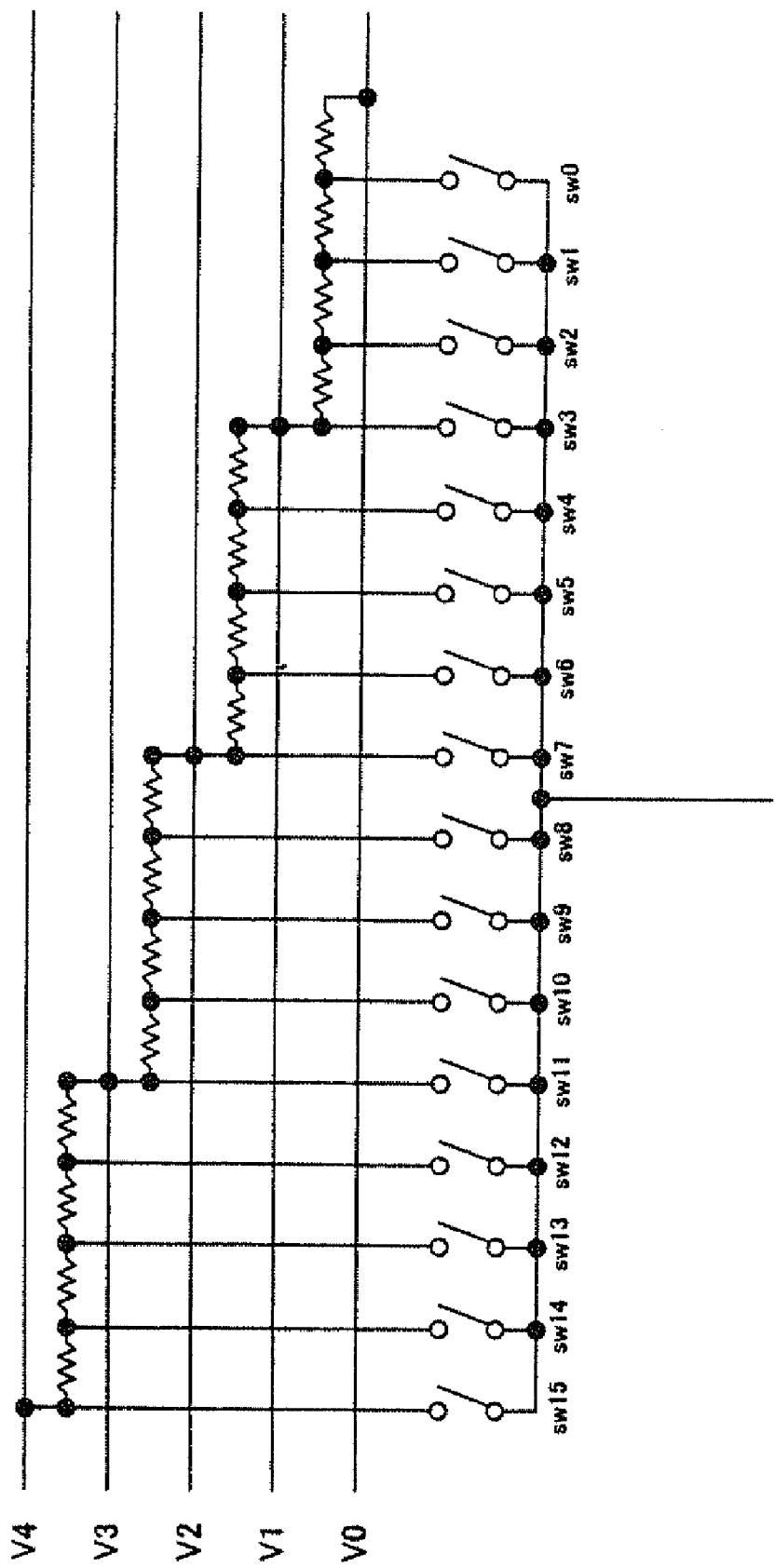
FIG. 21 shows another D/A conversion circuit to be used in the conventional digital driving type liquid crystal display device.

In Embodiment 5, an example of a D/A conversion circuit that is different from that in Embodiment 1 will be described with reference to FIG. 18. The circuit configuration in FIG. 18 is the same as that shown in FIG. 3, except that a buffer circuit is additionally provided. The same components bear the same reference numerals in these two drawings.

In the circuit configuration shown in FIG. 18, the second D/A conversion circuit 1114 is provided with a buffer circuit 1113 (which is an operational amplifier, a source follower, or the like) connected to the second output line 1115. Such a circuit configuration is preferable since an input to the buffer circuit can be of high impedance with this circuit configuration, which can in turn allow requirements for the analog switch to be mitigated.

Embodiment 6

The present invention is applicable to the overall range of the conventional IC technology. More specifically, the present invention can be applied to any kinds of semiconductor circuits commercially available in the current market. For example, the present invention can be applied to microprocessors integrated in one chip, such as a RISC microprocessor, an ASIC microprocessor, or the like. The present invention is also applicable to various circuits ranging from a signal processing circuit to be used in a D/A converter or the like to a high frequency circuit to be used in a portable equipment (such as a mobile phone, a PHS, or a mobile computer).

Embodiment 7

The circuits manufactured by implementing the present invention can be utilized in various electro-optical devices. Namely, the present invention can be implemented on all of the electronic appliances that incorporate such electro-optical devices as display medium.

Examples of such electronic appliances include a video camera, a digital camera, a head mounted display (a goggle type display), a wearable display, a car navigation system, a personal computer and a portable information terminal (a mobile computer, a cellular telephone, an electronic book, etc.). FIG. 14A to 14F show examples of these.

Figure 14A:
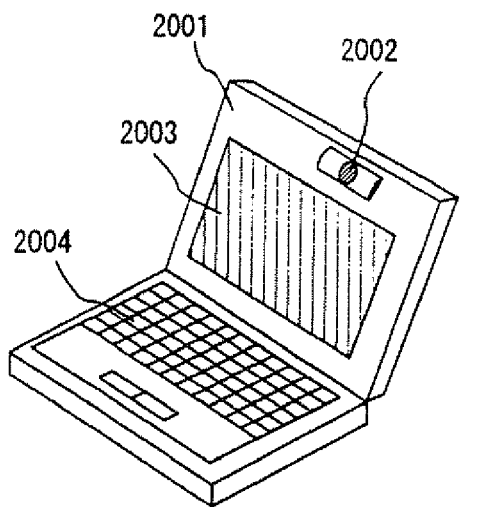
FIGS. 14A to 14F show exemplary diagrams of electronic equipment.

FIG. 14A shows a personal computer, which comprises: a main body 2001; an image input section 2002; a display region 2003; and a keyboard 2004. The present invention can be applied to the display region 2003 or other driver circuits.

Figure 14B:
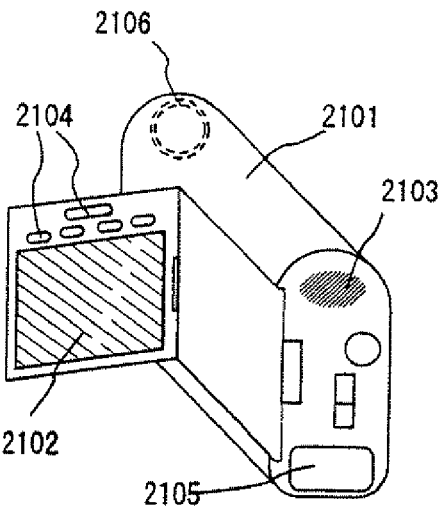

FIG. 14B shows a video camera, which comprises: a main body 2101; a display device 2102; a sound input section 2103; an operation switch 2104; a battery 2105; and an image receiving section 2106. The present invention can be applied to the display device 2102, the sound input section 2103 or other signal control circuits.

Figure 14C:
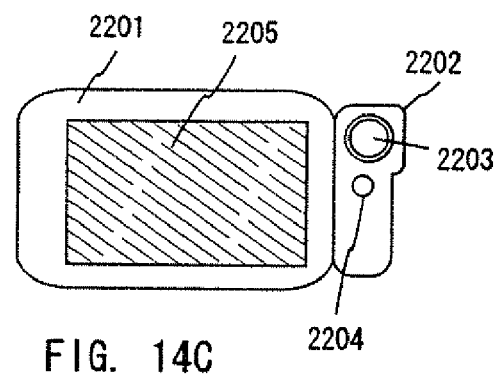

FIG. 14C shows a mobile computer, which comprises: a main body 2201; a camera section 2202; an image receiving section 2203; an operation switch 2204; and a display device 2205. The present invention can be applied to the display region 2205 or other driver circuits.

Figure 14D:
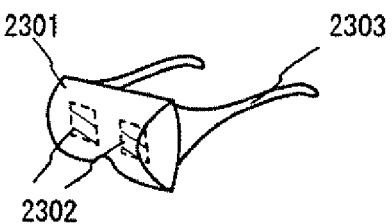

FIG. 14D shows a goggle type display, which comprises: a main body 2301; a display device 2302; and an arm section 2303. The present invention can be applied to the display region 2302 or other driver circuits.

Figure 14E:
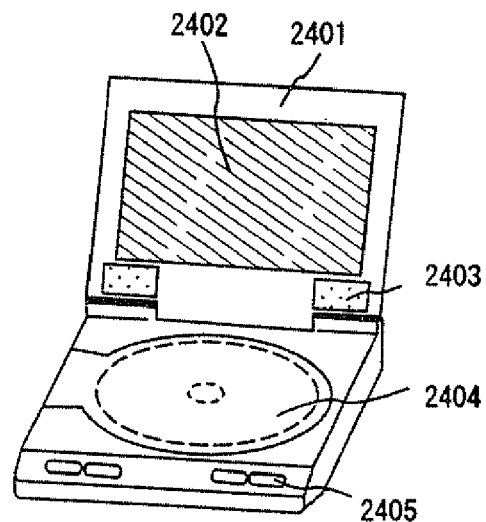

FIG. 14E shows a player that uses a recording medium storing a program (hereinafter called the "recording medium"). It comprises a main body 2401, a display region 2402, a speaker unit 2403, a recording medium 2404 and an operation switch 2405. Note that by using DVD (digital versatile disc), CD, etc., as a recording medium of this device, music appreciation, film appreciation, games or the use for Internet can be performed. The present invention can be applied to the display region 2402 or other driver circuits.

Figure 14F:
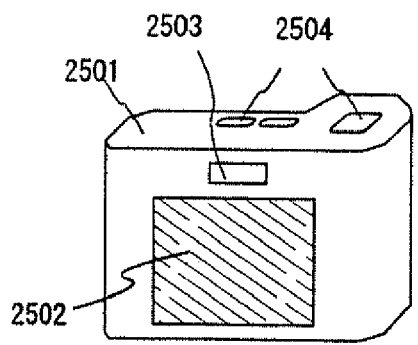

FIG. 14F shows a digital camera, which comprises: a main body 2501; a display region 2502; a view finder section 2503; an operation switch 2504; and an image receiving section (not shown). The present invention can be applied to the display region 2502 or other driver circuits.

As described above, the applicable range of the present invention is very large, and it can be applied to electronic appliances of various fields. The electronic appliances of the present Embodiment can be realized by using constitutions of any combination of Embodiments 1 to 6.

Embodiment 8

The TFTs manufactured by implementing the present invention can be utilized in various electro-optical devices. Namely, the present invention can be implemented on all of the electronic appliances that incorporate such electro-optical devices as display medium.

Projectors (front type or rear type) or the like can be given as such electronic appliances. An example is shown in FIGS. 15A to 15D.

Figure 15A:
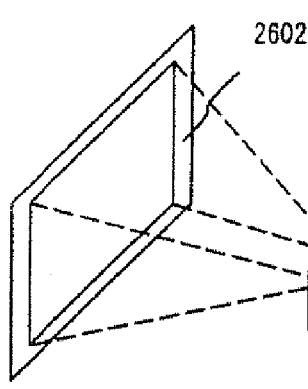
FIGS. 15A to 15D show other exemplary diagrams of electronic equipment.

FIG. 15A is a front type projector, which comprises a projection system 2601 and a screen 2602. The present invention can be applied to the projection system or other driver circuits.

Figure 15B:
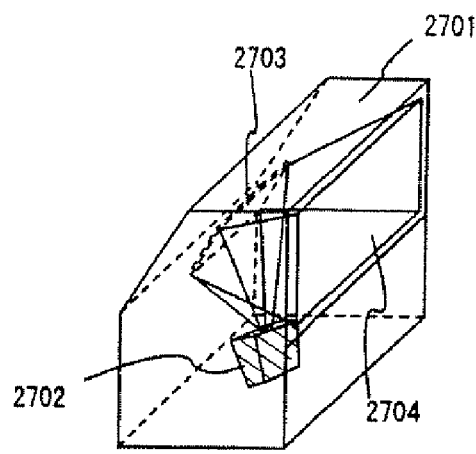

FIG. 15B is a rear type projector, which comprises a main body 2701, a projection system 2702, a mirror 2703 and a screen 2704. The present invention can be applied to the projection system or other driver circuits.

Figure 15C:
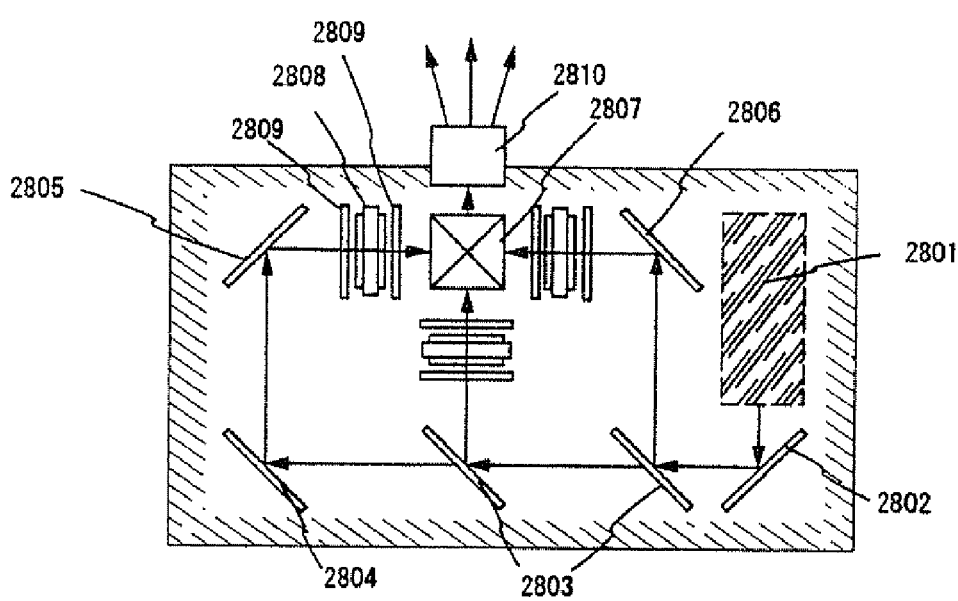

FIG. 15C is a diagram showing an example of the structure of the projection system 2601 and 2702 in FIGS. 15A and 15B. Projections systems 2601 and 2702 comprise: an optical light source system 2801; mirrors 2802 and 2804 to 2806; a dichroic mirror 2803; a prism 2807 a liquid crystal display device 2808; a phase differentiating plate 2809; and a projection optical system 2810. The projection optical system 2810 comprises an optical system including a projection lens. Though the present Embodiment shows an example of three plate type, it is not specifically limited to this type, and it may for instance be a single plate type. Further, the operator may appropriately dispose in the optical path shown by an arrow in FIG. 15C, an optical lens, a film having light polarizing function, a film for adjusting phase difference, or an IR film, etc.

Figure 15D:
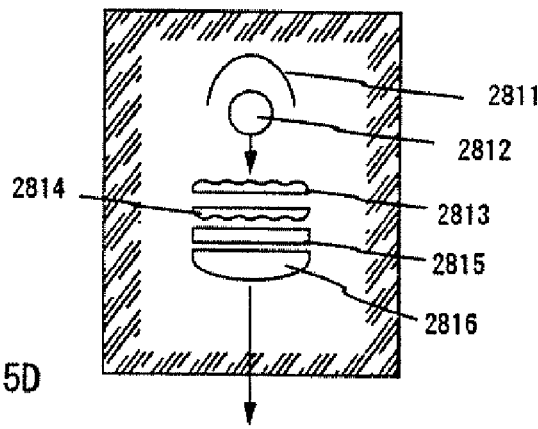

FIG. 15D is a diagram showing an example of the structure of the optical light source system 2801 of FIG. 15C. In this Embodiment the optical light source system 2801 comprises a reflector 2811, light sources 2812, 2813 and 2814, light polarizer conversion element 2815 and a condenser lens 2816. Note that the optical light source system shown in FIG. 15D is merely an example and the structure is not specifically limited to this example. For example, the operator may appropriately dispose an optical system such as an optical lens, a film having light polarizing function, a film for adjusting phase difference, IR film, etc., in the optical light source system.

As described above, the applicable range of the present invention is very large, and it is possible to apply the invention to electronic appliances of various areas. Further, the electronic appliances of this Embodiment can be realized by using constitutions of any combination of Embodiments 1 to 5.

As described above, a D/A conversion circuit in accordance with the present invention allows a writing operation of a voltage (a true gradation voltage) to be performed at a higher speed by first applying a first voltage (a voltage close to the true gradation voltage), which is supplied without passing through a resistor element, to an output line and then applying a second voltage (the true gradation voltage), which is supplied via the resistor element, to the output line.

Specifically, in the D/A conversion circuit of the present invention, the first voltage is written to the output line beforehand and then the second voltage is written to the output line so as to increase the voltage level from the first voltage to the true gradation voltage. Thus, a display voltage can be written at a very fast speed, as compared to the conventional art.

What is claimed is:

1. A display device comprising:
a pixel portion including a signal line; and
a driver circuit comprising:
a first D/A conversion circuit; and
a second D/A conversion circuit,
wherein the second D/A conversion circuit is a resistor string D/A conversion circuit,
wherein the first D/A conversion circuit is configured to output a first voltage and a second voltage and to supply the first voltage and the second voltage to the second D/A conversion circuit,
wherein the second D/A conversion circuit is configured to output a third voltage to the signal line, and
wherein the driver circuit is configured to output the first voltage to the signal line just before the third voltage is outputted to the signal line.

2. The display device according to claim 1,
wherein the driver circuit comprises a thin film transistor.

3. The display device according to claim 2,
wherein the driver circuit comprises a thin film transistor.

4. The display device according to claim 3, wherein the thin film transistor comprises a crystalline silicon film.

5. The display device according to claim 2, wherein the thin film transistor comprises a crystalline silicon film.

6. The display device according to claim 1, further comprising a liquid crystal material.

7. The display device according to claim 1,
wherein the driver circuit further comprises a shift register and a latch circuit.

8. A display device comprising:
a pixel portion including a signal line; and
a driver circuit comprising:
a first D/A conversion circuit;
a second D/A conversion circuit; and
a switch,
wherein the signal line is electrically connected to the first D/A conversion circuit through at least the switch,
wherein the second D/A conversion circuit is a resistor string D/A conversion circuit,
wherein the first D/A conversion circuit is configured to output a first voltage and a second voltage and to supply the first voltage and the second voltage to the second D/A conversion circuit,
wherein the second D/A conversion circuit is configured to output a third voltage to the signal line, and
wherein the driver circuit is configured to output the first voltage to the signal line through the switch just before the third voltage is outputted to the signal line.

9. The display device according to claim 8,
wherein the driver circuit comprises a thin film transistor.

10. The display device according to claim 9, wherein the thin film transistor comprises a crystalline silicon film.

11. The display device according to claim 8, further comprising a liquid crystal material.

12. The display device according to claim 8,
wherein the driver circuit further comprises a shift register and a latch circuit.

13. A display device comprising:
a pixel portion including a signal line; and
a driver circuit comprising:
   a first D/A conversion circuit; and
   a second D/A conversion circuit,
wherein the first D/A conversion circuit comprises a plurality of voltage lines, and the first D/A conversion circuit is configured to select adjacent two of the plurality of voltage lines,
wherein the second D/A conversion circuit is a resistor string D/A conversion circuit,
wherein the first D/A conversion circuit is configured to output a first voltage and a second voltage and to supply the first voltage and the second voltage to the second D/A conversion circuit,
wherein the second D/A conversion circuit is configured to output a third voltage to the signal line, and
wherein the driver circuit is configured to output the first voltage to the signal line just before the third voltage is outputted to the signal line.

14. The display device according to claim 13,
wherein the driver circuit comprises a thin film transistor.

15. The display device according to claim 14, wherein the thin film transistor comprises a crystalline silicon film.

16. The display device according to claim 13, further comprising a liquid crystal material.

17. The display device according to claim 13,
wherein the driver circuit further comprises a shift register and a latch circuit.

18. A display device comprising:
a pixel portion including a plurality of signal lines; and
a driver circuit comprising:
   a first D/A conversion circuit;
   a second D/A conversion circuit; and
   a switching circuit,
wherein the second D/A conversion circuit is a resistor string D/A conversion circuit,
wherein the first D/A conversion circuit is configured to output a first voltage and a second voltage and to supply the first voltage and the second voltage to the second D/A conversion circuit,
wherein the switching circuit is configured to select one of the plurality of signal lines,
wherein the second D/A conversion circuit is configured to output a third voltage to the selected one of the plurality of signal lines, and
wherein the driver circuit is configured to output the first voltage to the selected one of the plurality of signal lines just before the third voltage is outputted to the selected one of the plurality of signal lines.

19. The display device according to claim 18, further comprising a liquid crystal material.

20. The display device according to claim 18,
wherein the driver circuit further comprises a shift register and a latch circuit.

* * * * *

UNITED STATES PATENT AND TRADEMARK OFFICE
CERTIFICATE OF CORRECTION

PATENT NO.         : 7,750,833 B2                                    Page 1 of 1
APPLICATION NO.    : 12/188739
DATED              : July 6, 2010
INVENTOR(S)        : Yukio Tanaka It is certified that error appears in the above-identified patent and that said Letters Patent is hereby corrected as shown below:

In the Specification:

- Column 11, line 44: "(R1 to R2)" should be corrected to "(R1 to $R2^y$)" -

- Column 15, line 53: "gathered" should be corrected to "gettered" -

Signed and Sealed this
Fifteenth Day of February, 2011

David J. Kappos
*Director of the United States Patent and Trademark Office*